(12) United States Patent
Tago et al.

(10) Patent No.: US 12,142,072 B2
(45) Date of Patent: Nov. 12, 2024

(54) DETECTION DEVICE

(71) Applicant: Japan Display Inc., Tokyo (JP)

(72) Inventors: Keiji Tago, Tokyo (JP); Kimitoshi Ohgiichi, Tokyo (JP); Satoru Kawasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/218,676

(22) Filed: Jul. 6, 2023

(65) Prior Publication Data

US 2023/0343132 A1 Oct. 26, 2023

Related U.S. Application Data

(63) Continuation of application No. 17/726,794, filed on Apr. 22, 2022, now Pat. No. 11,741,741.

(30) Foreign Application Priority Data

Apr. 28, 2021 (JP) ................................ 2021-076581

(51) Int. Cl.
*G06V 40/13* (2022.01)
*H01L 31/0216* (2014.01)

(52) U.S. Cl.
CPC ...... *G06V 40/1318* (2022.01); *G06V 40/1329* (2022.01); *H01L 31/02164* (2013.01)

(58) Field of Classification Search
None
See application file for complete search history.

(56) References Cited

U.S. PATENT DOCUMENTS

| 2015/0187980 | A1 | 7/2015 | Yamamoto |
| 2018/0239941 | A1 | 8/2018 | Mackey et al. |
| 2019/0080140 | A1 | 3/2019 | Lee et al. |
| 2020/0089928 | A1 | 3/2020 | Long |
| 2021/0034832 | A1* | 2/2021 | Lee ........................ H10K 59/65 |
| 2021/0058364 | A1* | 2/2021 | Tillotson ............. H04L 61/2514 |

(Continued)

FOREIGN PATENT DOCUMENTS

| CN | C112711976 A | 4/2021 |
| JP | H09-171154 A | 6/1997 |

(Continued)

OTHER PUBLICATIONS

Office Action issued in related Japanese Patent Application No. 2021-076581, mailed on Aug. 6, 2024 and English translation of same. 5 pages.

(Continued)

*Primary Examiner* — Joseph R Haley
(74) *Attorney, Agent, or Firm* — K&L Gates LLP

(57) ABSTRACT

According to an aspect, a detection device includes: a substrate; a plurality of photodiodes provided to the substrate and arranged in a first direction; a plurality of lenses provided so as to overlap the photodiodes; and a light-blocking layer provided between the photodiodes and the lenses and having a plurality of openings. More than one of the openings is provided in each of regions overlapping the respective photodiodes, and an arrangement direction of the openings in each of the regions overlapping the respective photodiodes is at an angle to the first direction.

5 Claims, 14 Drawing Sheets

(56) References Cited

U.S. PATENT DOCUMENTS

2021/0124893 A1    4/2021   Wang et al.

FOREIGN PATENT DOCUMENTS

| | | |
|---|---|---|
| JP | 2005-019958 A | 1/2005 |
| JP | 2019-049716 A | 3/2019 |

OTHER PUBLICATIONS

Office Action issued in related Chinese Patent Application No. 202210451979.9, mailed on Aug. 1, 2024 and English translation of same. 17 pages.

Office Action issued in related Korean Patent Application No. 10-2022-0051924, issued on Sep. 12, 2024 and English translation of same. 12 pages.

\* cited by examiner

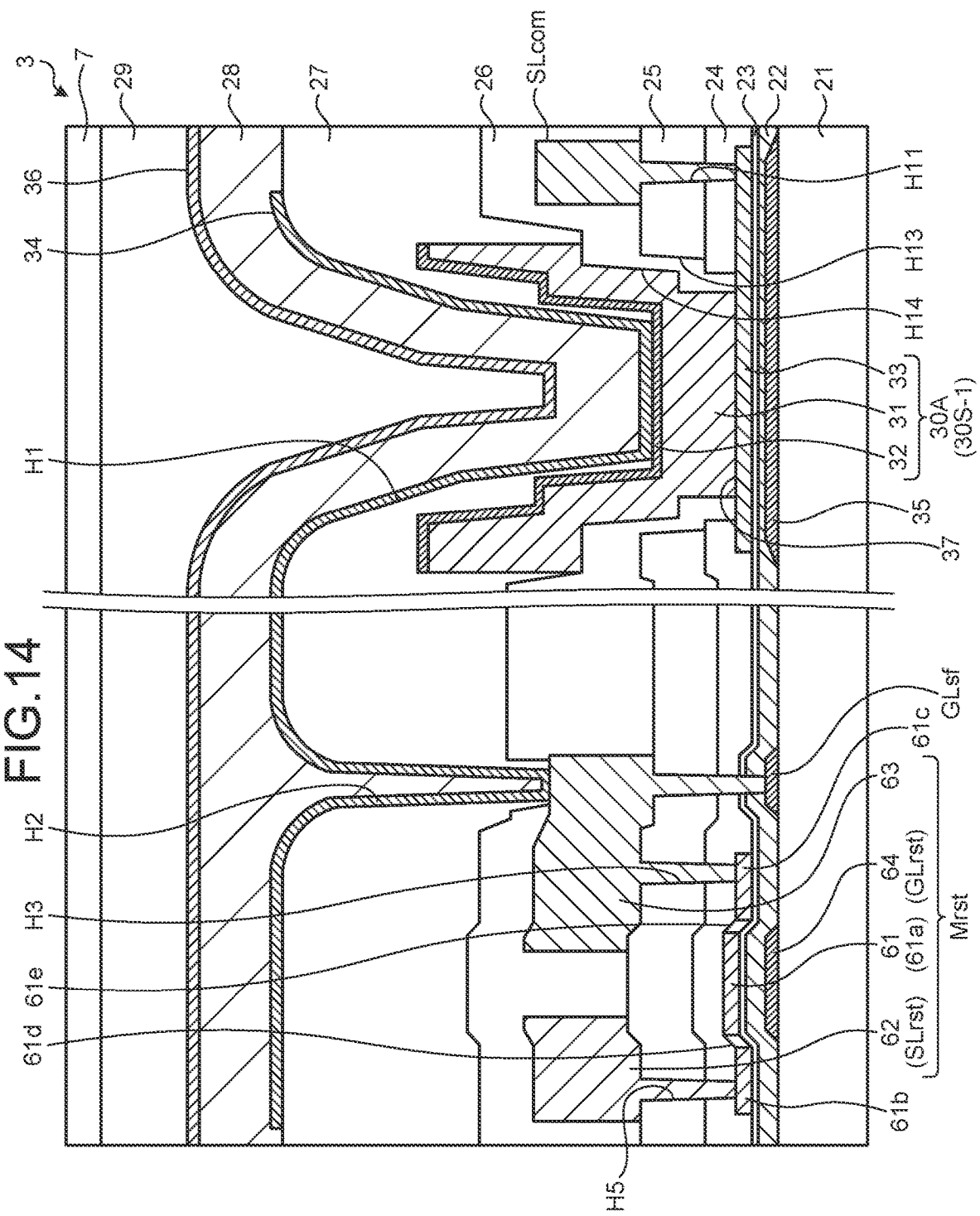

DETECTION DEVICE

CROSS-REFERENCE TO RELATED APPLICATION

The present application is a continuation of U.S. patent application Ser. No. 17/726,794, filed on Apr. 22, 2022, which application claims the benefit of priority from Japanese Patent Application No. 2021-076581 filed on Apr. 28, 2021, the entire contents of which are incorporated herein by reference.

BACKGROUND

1. Technical Field

What is disclosed herein relates to a detection device.

2. Description of the Related Art

Japanese Patent Application Laid-open Publication No. H09-171154 describes an image input optical system that includes a lens array having a plurality of arranged lenses, a photosensor array having a plurality of arranged photosensors, and a pinhole array provided between the lens array and the photosensor array. United States Patent Application Publication No. 2020/0089928 describes an optical imaging device having a light-blocking layer provided with an opening between a microlens and a photosensor.

United States Patent Application Publication No. 2018/0239941 (USP-A-2018/0239941) and Japanese Patent Application Laid-open Publication No. 2019-049716 (JP-A-2019-049716) each describe an optical fingerprint sensor disposed under a display device. In USP-A-2018/0239941, the arrangement direction of a plurality of photosensors on a silicon substrate is at an angle to the arrangement direction of pixels of the display device. In JP-A-2019-049716, the fingerprint sensor is provided at an angle to a long axis direction of the display device.

A relation between the arrangement of, for example, photodiodes of the photosensors and the arrangement of, for example, wiring and light-emitting elements of the display device arranged above the photosensors may generate unintended patterns such as moiré patterns (interference fringes) in light that is incident on the photosensors. The technologies of USP-A-2018/0239941 and JP-A-2019-049716 may be difficult to be achieved due to major restrictions on the manufacturing process of the photosensors and the assembly process of the fingerprint sensor and the display device.

SUMMARY

According to an aspect, a detection device includes: a substrate; a plurality of photodiodes provided to the substrate and arranged in a first direction; a plurality of lenses provided so as to overlap the photodiodes; and a light-blocking layer provided between the photodiodes and the lenses and having a plurality of openings. More than one of the openings is provided in each of regions overlapping the respective photodiodes, and an arrangement direction of the openings in each of the regions overlapping the respective photodiodes is at an angle to the first direction.

According to an aspect, a detection device includes: a substrate; a plurality of photodiodes provided to the substrate and arranged in a first direction; a plurality of lenses provided so as to overlap the photodiodes; and a light-blocking layer provided between the photodiodes and the lenses and having a plurality of openings. More than one of the openings are provided in each of regions overlapping the respective photodiodes, and at least one of the openings in each of the regions overlapping the respective photodiodes has a diameter that differs from those of the other openings therein.

According to an aspect, a detection device includes: a substrate; a plurality of photodiodes provided to the substrate and arranged in a first direction; a plurality of lenses provided so as to overlap the photodiodes; and a light-blocking layer provided between the photodiodes and the lenses and having a plurality of openings. In each of regions overlapping the respective photodiodes, more than one of the openings and more than one of the lenses are provided, and the number of the openings differs from that of the lenses.

BRIEF DESCRIPTION OF THE DRAWINGS

FIG. 14 is a sectional view illustrating a schematic sectional configuration of a partial photodiode.

DETAILED DESCRIPTION

Figure 1:
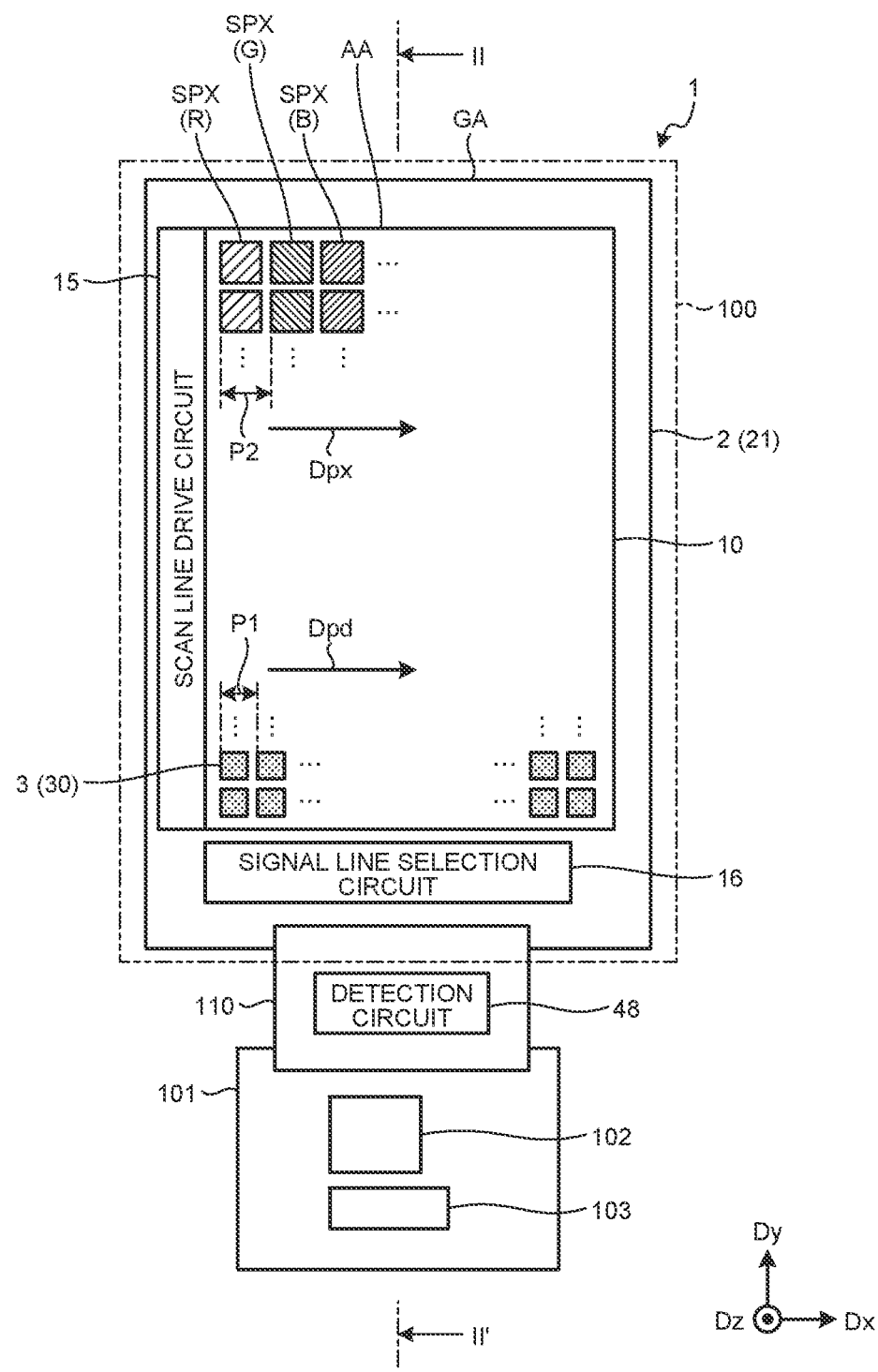
FIG. 1 is a plan view illustrating a detection device and a display device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same component as that described with reference to an already mentioned drawing is denoted by the same reference numeral throughout the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 2:
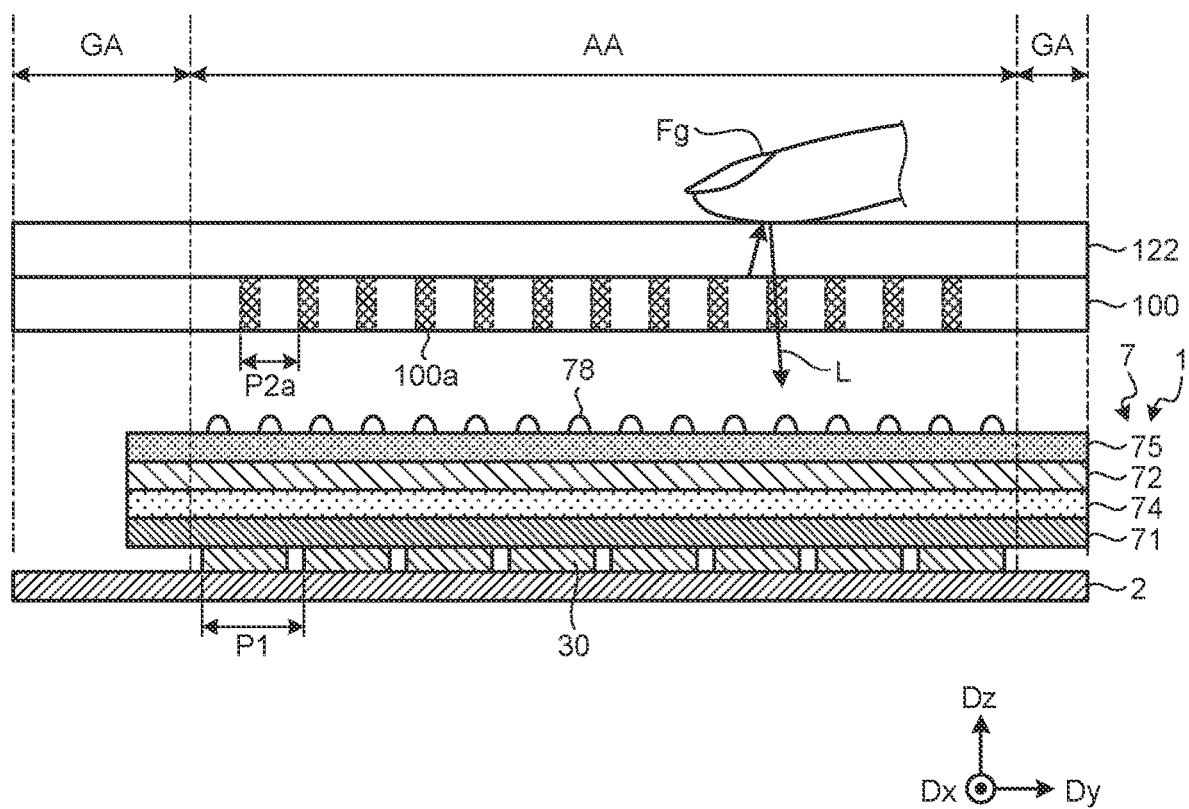
FIG. 2 is a II-II' sectional view of FIG. 1.

FIG. 1 is a plan view illustrating a detection device and a display device according to a first embodiment. FIG. 2 is a II-II' sectional view of FIG. 1. For ease of viewing, FIG. 1 illustrates a display device 100 with a long dashed double-short dashed line.

As illustrated in FIGS. 1 and 2, a detection device 1 according to the first embodiment is disposed on a lower side of the display device 100 (on a side thereof opposite to a cover member 122 illustrated in FIG. 2). The display device 100 is an organic electroluminescent (EL) (organic light-emitting diode (OLED)) display panel. As illustrated in FIG. 1, the display device 100 includes a plurality of sub-pixels SPX. The sub-pixels SPX are arranged in a matrix having a row-column configuration in a display region. The display region of the display device 100 is provided so as to overlap a detection region AA of the detection device 1. In FIG. 1, the entire area of the display region of the display device 100 overlaps the detection region AA of the detection device 1. However, the detection region AA of the detection device 1 may overlap a portion of the display region of the display device 100.

A sub-pixel SPX(R), a sub-pixel SPX(G), and a sub-pixel SPX(B) are repeatedly arranged in this order in a first direction Dx. Each set of the sub-pixels SPX(R), the sub-pixels SPX(G), and the sub-pixels SPX(B) are arranged in a second direction Dy. The sub-pixels SPX(R) display, for example, red (R). The sub-pixels SPX(G) display, for example, green (G). The sub-pixels SPX(B) display, for example, blue (B). The sub-pixels SPX are not limited to the three colors, but may be configured to display four or more colors.

In the following description, the first direction Dx is one direction in a plane parallel to a substrate 21 of the detection device 1. The second direction Dy is one direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy and is a direction normal to the substrate 21. The term "plan view" refers to a positional relation as viewed from the third direction Dz.

The display device 100 is not limited to the organic EL display panel. The display device 100 may be, for example, an inorganic EL display panel (micro LED or mini LED), a liquid crystal display (LCD) panel using liquid crystal elements as display elements, or an electrophoretic display (EPD) panel using electrophoretic elements as the display elements.

As illustrated in FIG. 1, the detection device 1 includes an array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor 10, the scan line drive circuit 15, and the signal line selection circuit 16 to control operations of the sensor 10. The power supply circuit 103 supplies voltage signals including, for example, a power supply potential VDD and a reference potential VCOM (refer to FIG. 4) to the sensor 10, the scan line drive circuit 15, and the signal line selection circuit 16. Although the present embodiment exemplifies the case of disposing the detection circuit 48 on the wiring substrate 110, the present disclosure is not limited to this case. The detection circuit 48 may be disposed on the substrate 21.

The substrate 21 has the detection region AA and a peripheral region GA. The detection region AA and the peripheral region GA extend in planar directions parallel to the substrate 21. Each element (detection element 3) of the sensor 10 is provided in the detection region AA. The peripheral region GA is a region outside the detection region AA, and is a region not provided with the element (detection element 3). That is, the peripheral region GA is a region between the outer perimeter of the detection region AA and the ends of the insulating substrate 21. The scan line drive circuit 15 and the signal line selection circuit 16 are provided in the peripheral region GA. The scan line drive circuit 15 is provided in a region extending along the second direction Dy in the peripheral region GA. The signal line selection circuit 16 is provided in a region extending along the first direction Dx in the peripheral region GA and is provided between the sensor 10 and the detection circuit 48.

Each of the detection elements 3 of the sensor 10 is a photosensor including a photodiode 30 as a sensor element. The photodiode 30 is a photoelectric conversion element, and outputs an electrical signal corresponding to light irradiating each of the photodiodes 30. More specifically, the photodiode 30 is a positive-intrinsic-negative (PIN) photodiode. The photodiode 30 may also be an organic photo diode (OPD).

The detection elements 3 (photodiodes 30) are arranged in a matrix having a row-column configuration in the detection region AA. More specifically, an arrangement direction Dpd of the photodiodes 30 is parallel to an arrangement direction Dpx of the sub-pixels SPX. In FIG. 1, both the arrangement direction Dpd and the arrangement direction Dpx are parallel to the first direction Dx. An arrangement pitch P1 in the first direction Dx of the photodiodes 30 differs from an arrangement pitch P2 in the first direction Dx of the sub-pixels SPX. For example, the arrangement pitch P1 is less than the arrangement pitch P2.

Also, in the second direction Dy, the arrangement direction of the photodiodes 30 is parallel to the arrangement direction of the sub-pixels SPX and parallel to the second direction Dy. The arrangement pitch in the second direction Dy of the photodiodes 30 differs from the arrangement pitch in the second direction Dy of the sub-pixels SPX. The arrangement pitch in the second direction Dy of the photodiodes 30 is less than the arrangement pitch in the second direction Dy of the sub-pixels SPX.

The photodiode 30 included in each of the detection elements 3 performs the detection in accordance with a gate drive signal (for example, a reset control signal RST or a read control signal RD) supplied from the scan line drive circuit 15. Each of the photodiodes 30 outputs the electrical signal corresponding to the light irradiating the photodiode 30 as a detection signal Vdet to the signal line selection circuit 16. The detection device 1 detects information on a living body based on the detection signals Vdet received from the photodiodes 30.

As illustrated in FIG. 2, the display device 100 and the cover member 122 are stacked on the detection device 1 in the order as listed. The detection device 1 includes the array substrate 2, the photodiodes 30, and an optical filter 7. FIG. 2 schematically illustrates a layered configuration of the array substrate 2, the photodiodes 30, and optical filter 7. An adhesive layer (not illustrated) is provided between the detection device 1 (optical filter 7) and the display device 100, and between the display device 100 and the cover member 122.

The cover member 122 is a member for protecting the display device 100 and the detection device 1, and covers the display device 100 and the detection device 1. The cover member 122 is, for example, a glass substrate. The cover member 122 is not limited to a glass substrate and may be, for example, a resin substrate. The cover member 122 need not be provided.

A portion of light L (display light) emitted from the display device 100 passes through the cover member 122 and is reflected by a finger Fg serving as a detection target.

The light L reflected by the finger Fg passes through light-transmitting regions 100a of the display device 100 and enters the detection device 1. The light-transmitting regions 100a are regions of the display device 100 that do not overlap elements, such as light-emitting elements and transistors, and various types of wiring, and are also called open regions. Although the arrangement direction and an arrangement pitch P2a of the light-transmitting regions 100a vary depending on the light-emitting elements and the circuit configuration of the display device 100, the light-transmitting regions 100a are formed so as to correspond, as a whole, to the arrangement direction Dpx and the arrangement pitch P2 of the sub-pixels SPX illustrated in FIG. 1.

The detection device 1 detects asperities (such as a fingerprint) on a surface of the finger Fg by detecting the light L reflected by the finger Fg. The detection device 1 may further detect the information on the living body by detecting the light L reflected in the finger Fg, in addition to detecting the fingerprint. Examples of the information on the living body include a blood vessel image, pulsation, and a pulse wave of a vein or the like.

The optical filter 7 is provided on the photodiodes 30. The optical filter 7 is an optical element that receives the light L reflected by an object to be detected such as the finger Fg, transmits, toward the photodiodes 30, components of the light L traveling in the third direction Dz, and blocks components of the light L traveling in oblique directions. The optical filter 7 is also called "collimating apertures" or "collimator".

The optical filter 7 is provided over the detection region AA and the peripheral region GA. The optical filter 7 includes a first light-blocking layer 71, a second light-blocking layer 72, a first light-transmitting resin layer 74, a second light-transmitting resin layer 75, and a lens 78. In the present embodiment, the first light-blocking layer 71, the first light-transmitting resin layer 74, the second light-blocking layer 72, the second light-transmitting resin layer 75, and the lens 78 are stacked on the array substrate 2 and the photodiodes 30 in the order as listed. A plurality of lenses 78 are provided in the detection region AA and are provided so as to overlap the photodiodes 30. The light L reflected by the object to be detected such as the finger Fg is condensed by each of the lenses 78 and emitted to the photodiode 30 corresponding to the lens 78.

A detailed configuration of the array substrate 2, the photodiode 30, and the optical filter 7 having the lenses 78 will be described later.

Figure 3:
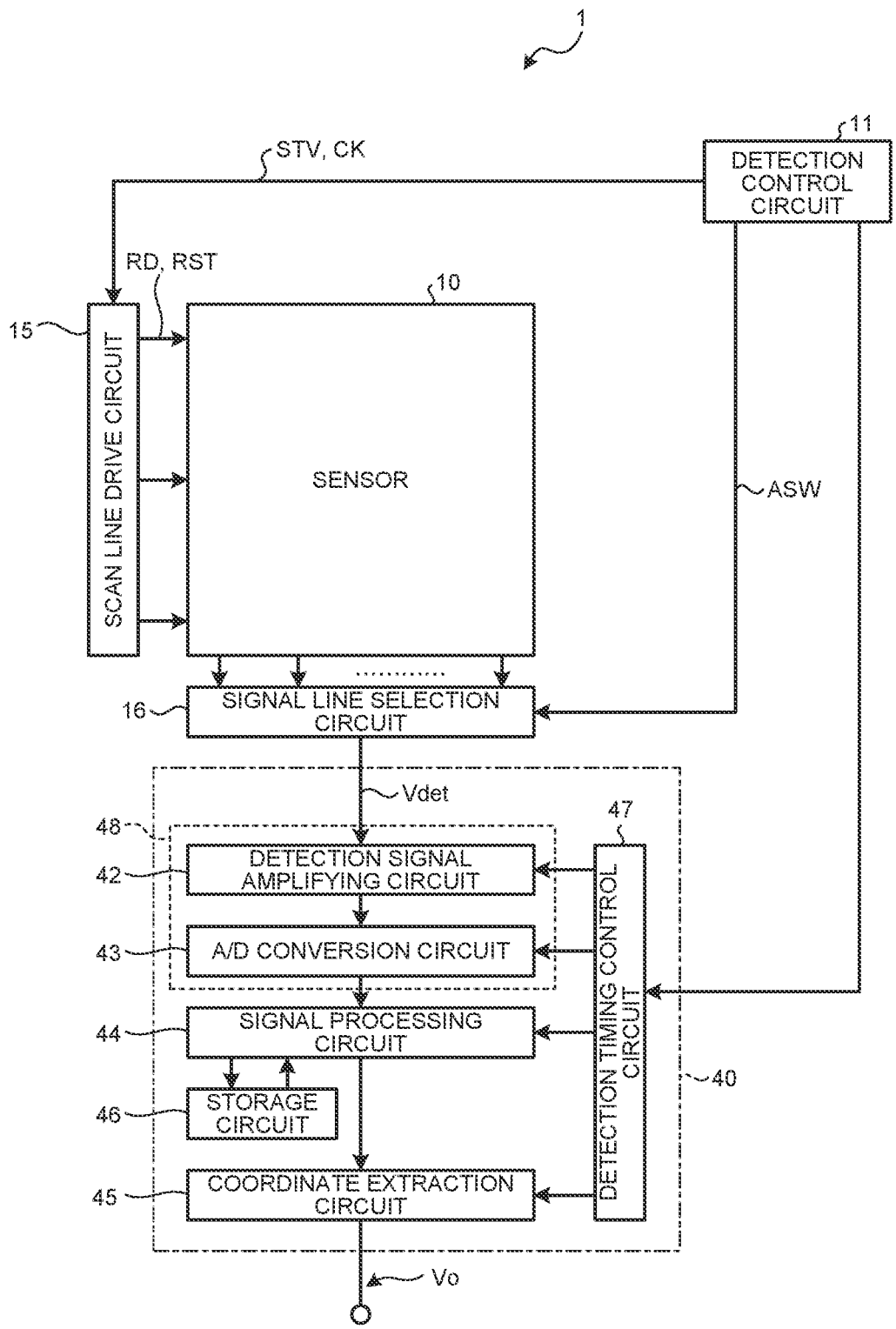
FIG. 3 is a block diagram illustrating a configuration example of the detection device according to an embodiment.

FIG. 3 is a block diagram illustrating a configuration example of the detection device according to the embodiment. As illustrated in FIG. 3, the detection device 1 further includes a detection control circuit 11 and a detector 40. One, some, or all functions of the detection control circuit 11 are included in the control circuit 102. One, some, or all functions of the detector 40 other than those of the detection circuit 48 are also included in the control circuit 102.

The detection control circuit 11 is a circuit that supplies control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (a read control scan line GLrd and a reset control scan line GLrst (refer to FIG. 4)) based on various control signals. The scan line drive circuit 15 sequentially or simultaneously selects the scan lines and supplies the gate drive signal (for example, the reset control signal RST or the read control signal RD) to the selected scan lines. Through this operation, the scan line drive circuit 15 selects the photodiodes 30 coupled to the scan lines.

Figure 4:
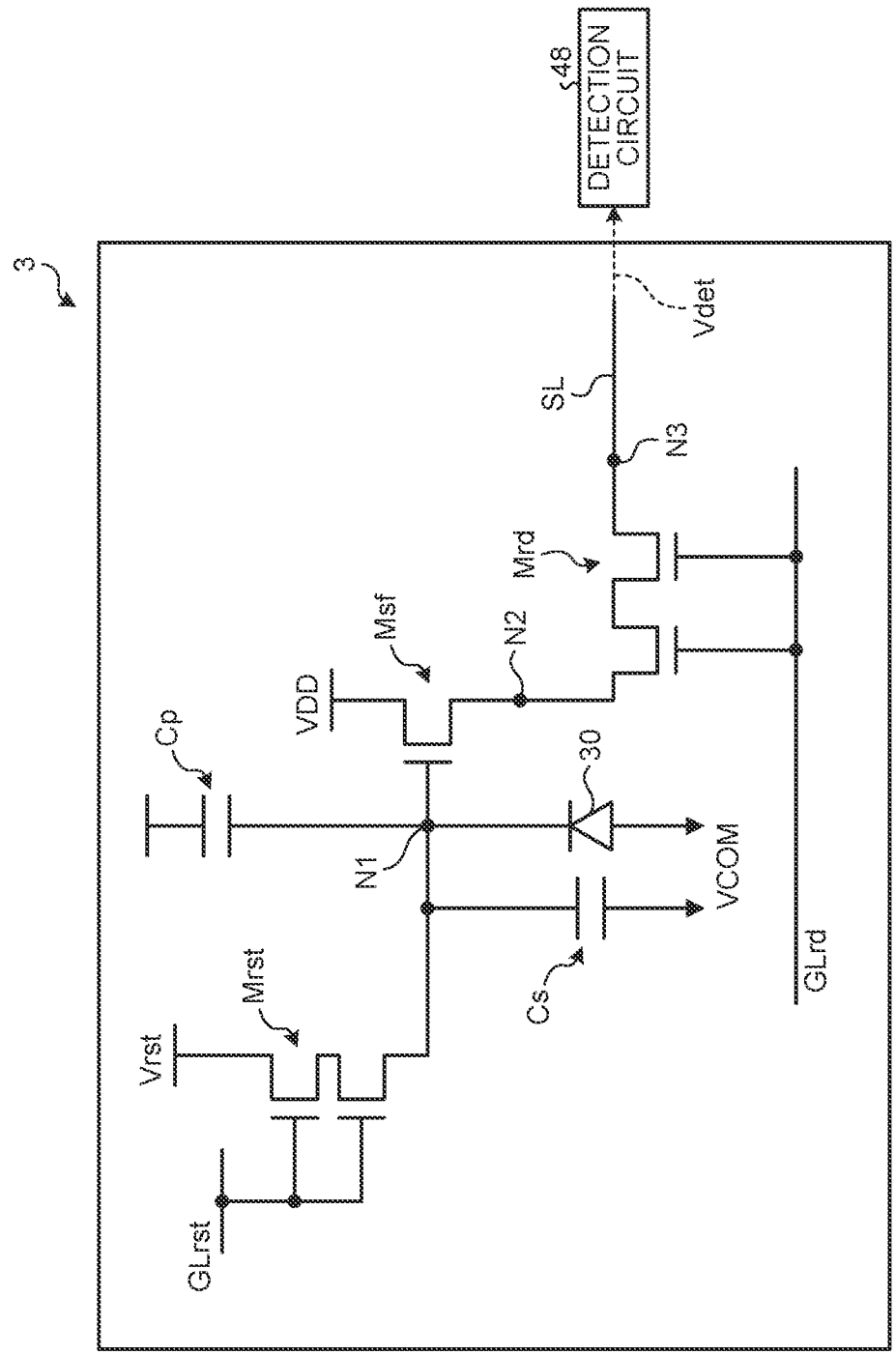
FIG. 4 is a circuit diagram illustrating a detection element.

The signal line selection circuit 16 is a switching circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. Through this operation, the signal line selection circuit 16 outputs the detection signal Vdet of the photodiode 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet, and is, for example, an integration circuit. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect asperities on a surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image of the finger Fg or the palm, a pulse wave, pulsation, and blood oxygen saturation.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating the detected coordinates.

The following describes a circuit configuration example of the detection device 1. FIG. 4 is a circuit diagram illustrating the detection element. As illustrated in FIG. 4, each of the detection elements 3 includes the photodiode 30, a reset transistor Mrst, a read transistor Mrd, and a source follower transistor Msf. The reset transistor Mrst, the read transistor Mrd, and the source follower transistor Msf are provided so as to correspond to each of the photodiodes 30. The reset transistor Mrst, the read transistor Mrd, and the source follower transistor Msf are each made up of an n-type thin-film transistor (TFT). However, each of the transistors is not limited thereto, and may be made up of a p-type TFT.

The reference potential VCOM is applied to the anode of the photodiode 30. The cathode of the photodiode 30 is coupled to a node N1. The node N1 is coupled to a capacitive element Cs, one of the source and the drain of the reset transistor Mrst, and the gate of the source follower transistor Msf. The node N1 further has parasitic capacitance Cp. When light is incident on the photodiode 30, a signal (electrical charge) output from the photodiode 30 is stored in the capacitive element Cs. The capacitive element Cs is, for example, a capacitor formed between an upper electrode 34 coupled to the photodiode 30 and a lower electrode 35 (refer to FIG. 8). The parasitic capacitance Cp is capacitance added to the capacitive element Cs and is generated among various types of wiring and electrodes provided on the array substrate 2.

The gates of the reset transistor Mrst are coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with the signal (electrical charge) generated by the photodiode 30. This operation causes the source follower transistor Msf to output a voltage signal corresponding to the signal (electrical charge) generated by the photodiode 30 to the read transistor Mrd.

The read transistor Mrd is coupled between the source of the source follower transistor Msf (node N2) and a corresponding one of the output signal lines SL (node N3). The gates of the read transistor Mrd are coupled to the read control scan line GLrd. After the read transistor Mrd is turned on in response to the read control signal RD, the signal output from the source follower transistor Msf, that is, the voltage signal corresponding to the signal (electrical charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may have a single-gate structure or may have a multi-gate structure in which three or more transistors are coupled in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 5:
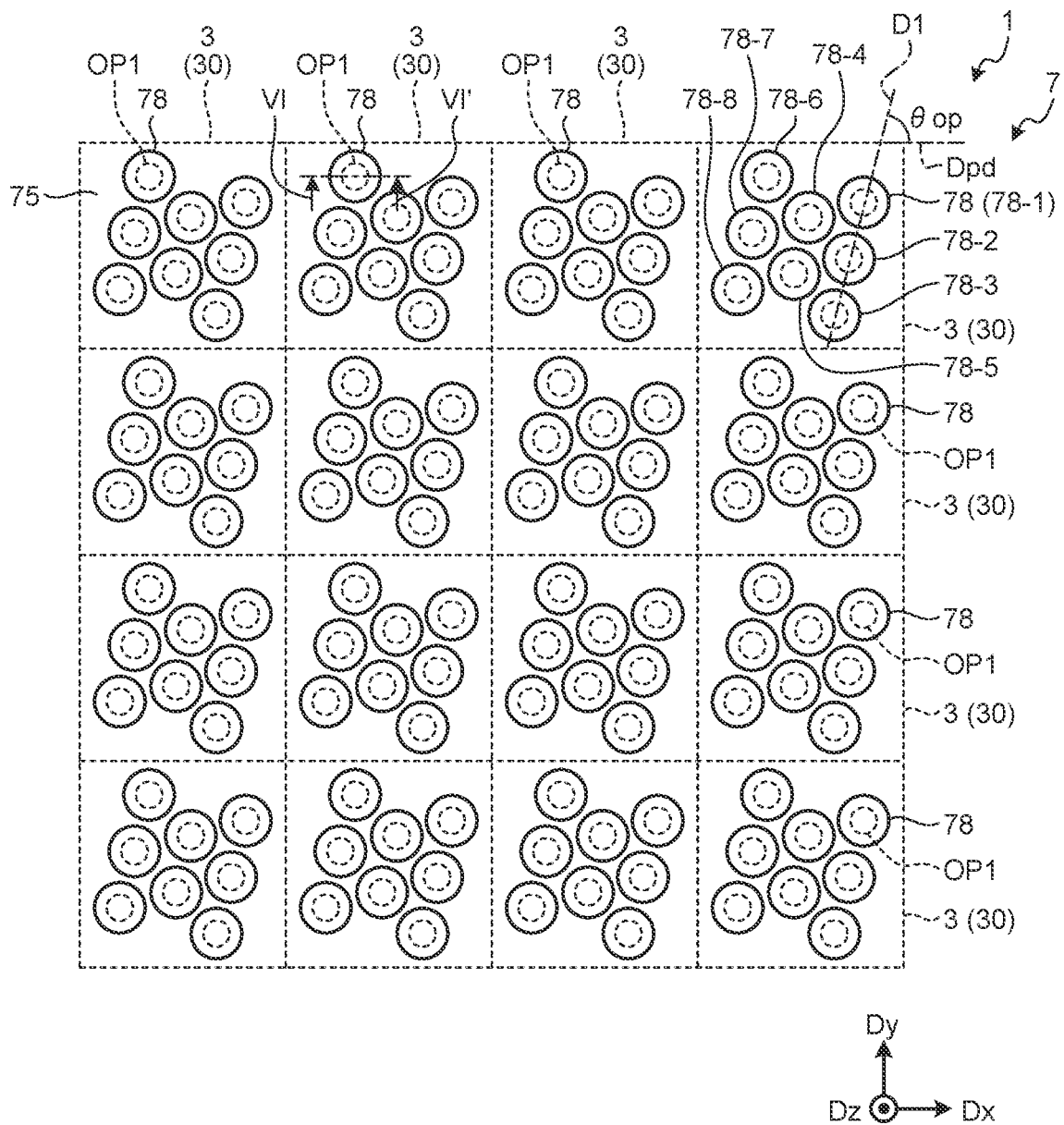
FIG. 5 is a plan view illustrating an optical filter according to the first embodiment.

The following describes a detailed configuration of the detection element 3 and the optical filter 7. FIG. 5 is a plan view illustrating the optical filter according to the first embodiment.

As illustrated in FIG. 5, the optical filter 7 is provided so as to cover the detection elements 3 (photodiodes 30) arranged in a matrix having a row-column configuration. The optical filter 7 includes the first light-transmitting resin layer 74 (refer to FIG. 6) and the second light-transmitting resin layer 75 that cover the photodiodes 30, and includes the lenses 78 provided for each of the detection elements 3. In each of the detection elements 3, the lenses 78 are arranged so as to overlap a corresponding one of the photodiodes 30. In the example illustrated in FIG. 5, eight lenses 78-1, 78-2, . . . , 78-8 among the lenses 78 are provided so as to overlap one of the photodiodes 30. The lenses 78-1, 78-2, . . . , 78-8 are arranged in a triangular grid pattern. However, the number of the lenses 78 arranged in each of the detection elements 3 may be seven or smaller, or nine or larger.

A first opening OP1 illustrated in FIG. 5 is formed in the first light-blocking layer 71 (refer to FIG. 6) so as to cause a component in the third direction Dz of the light L reflected by the object to be detected, such as the finger Fg, to enter the photodiode 30. The first openings OP1 are formed so as to overlap the respective lenses 78. More than one lens 78 and more than one first opening OP1 are arranged so as to overlap each of the photodiodes 30.

As illustrated in FIG. 5, in the plan view, in a region overlapping one of the photodiodes 30, an arrangement direction D1 of the lenses 78 and the first openings OP1 is at an angle to the first direction Dx (arrangement direction Dpd of the photodiodes 30). In more detail, the arrangement direction D1 of the lenses 78-1, 78-2, 78-3 and the first openings OP1 overlapping therewith is inclined at an angle Sop with respect to the arrangement direction Dpd (first direction Dx) of the photodiodes 30. The arrangement direction D1 is also inclined at a predetermined angle with respect to the second direction Dy. The arrangement direction D1 is a direction connecting the centers of at least two adjacent ones of the first openings OP1.

The lenses 78-4, 78-5 and the first openings OP1 overlapping therewith are arranged in a direction parallel to the arrangement direction D1, and are arranged adjacent to the lenses 78-1, 78-2, 78-3 and the first openings OP1 overlapping therewith. The lenses 78-6, 78-7, 78-8 and the first openings OP1 overlapping therewith are arranged in the direction parallel to the arrangement direction D1, and are arranged adjacent to the lenses 78-4, 78-5 and the first openings OP1 overlapping therewith.

In FIG. 5, the direction in which the lenses 78-1, 78-2, 78-3 and the first openings OP1 overlapping therewith are arranged is illustrated as the arrangement direction D1. However, the arrangement direction D1 is not limited to this direction and may be a direction connecting the centers of any adjacent two of the lenses 78 and two of the first openings OP1 overlapping therewith in a region overlapping one of the photodiodes 30. For example, when the discussion focuses on the lens 78-4, the arrangement direction D1 may be a direction connecting the centers of the adjacent two lenses 78-4, 78-5 and two of the first openings OP1 overlapping therewith in the region overlapping one of the photodiodes 30. The arrangement direction D1 may be a direction connecting the centers of the adjacent three lenses 78-1, 78-4, 78-7 and three of the first openings OP1 overlapping therewith. The arrangement direction D1 may be a direction connecting the centers of the adjacent three lenses 78-2, 78-4, 78-6 and three of the first openings OP1 overlapping therewith. In the present embodiment, each of the arrangement directions D1 is at an angle to the first direction Dx.

In the example illustrated in FIG. 5, each set of the lenses 78 and the first openings OP1 are formed to have the same shape (diameter) in the region overlapping one of the photodiodes 30. The lenses 78 and the first openings OP1 are formed in the same arrangement pattern in each of the detection elements 3 (photodiodes 30). That is, when two of the photodiodes 30 adjacent to each other in the first direction Dx are denoted as a first photodiode and a second photodiode, the arrangement direction D1 of the first openings OP1 in a region overlapping the first photodiode is parallel to the arrangement direction D1 of the first openings OP1 in a region overlapping the second photodiode.

With such a configuration, the lenses 78 and the first openings OP1 of the optical filter 7 are irregularly arranged in the first direction Dx (that is, in the arrangement direction Dpd of the photodiodes 30). In other words, in the arrangement direction Dpd of the photodiodes 30, an imbalance can be restrained from occurring between a region in which the lenses 78 and the first openings OP1 of the optical filter 7 are formed and a region in which the lenses 78 and the first openings OP1 of the optical filter 7 are not formed.

As described above, the arrangement direction Dpd of the photodiodes 30 of the detection device 1 is set to a direction parallel to the arrangement direction Dpx of the sub-pixels SPX of the display device 100, and the arrangement pitch P1 of the photodiodes 30 differs from the arrangement pitch P2 of the sub-pixels SPX (refer to FIG. 1). With this configuration, even when periodic regularity is present in the arrangement relation between the photodiodes 30 and the sub-pixels SPX, the lenses 78 and the first openings OP1 of the optical filter 7 are irregularly arranged in the arrangement direction Dpd of the photodiodes 30, and therefore, the light that is incident on the photodiodes 30 through the optical filter 7 can be restrained from generating a moiré pattern (unintended pattern such as a striped distribution of light).

Figure 6:
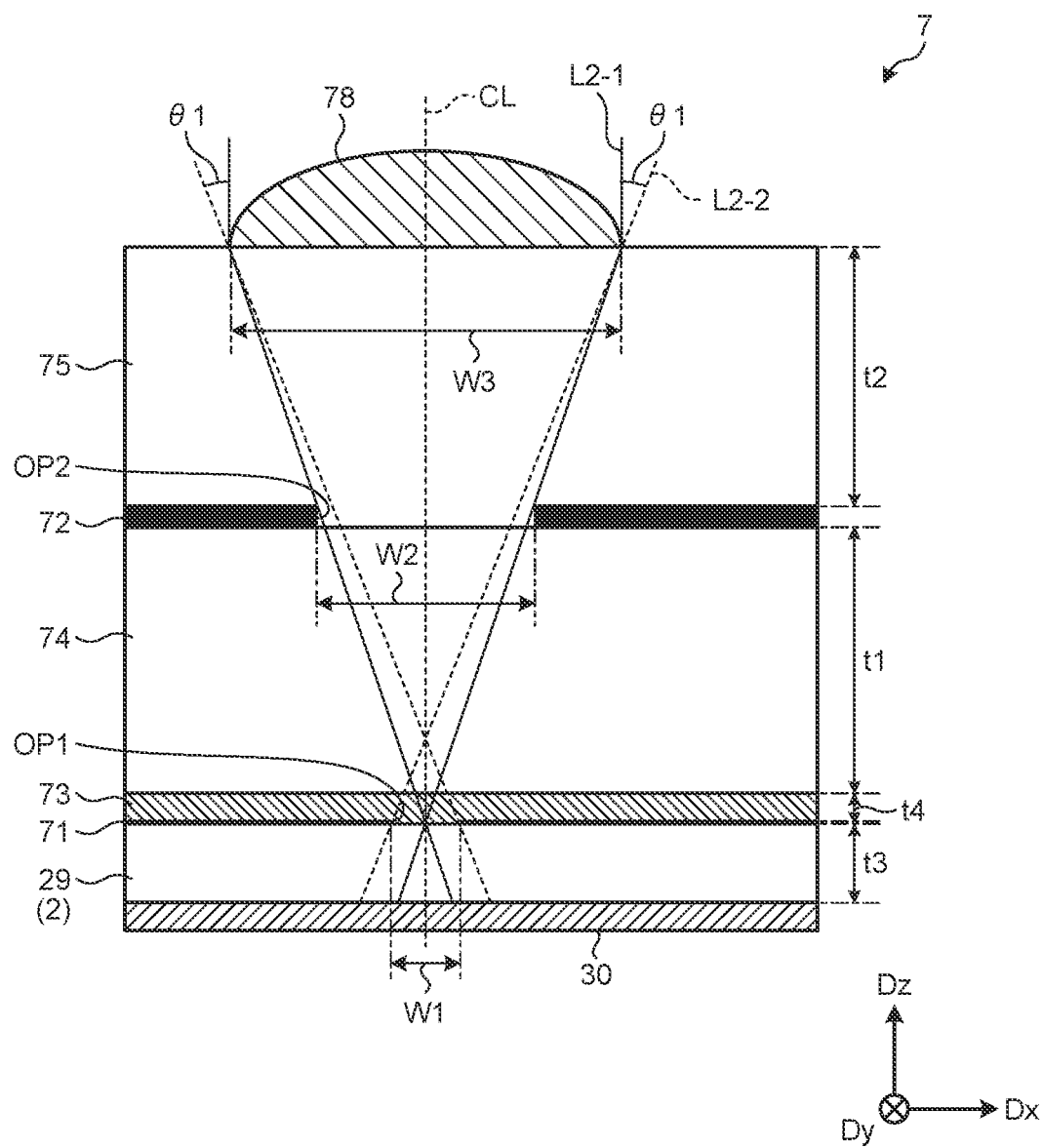
FIG. 6 is a sectional view illustrating the optical filter.

FIG. 6 is a sectional view illustrating the optical filter. FIG. 6 is a VI-VI' sectional view of FIG. 5. FIG. 6 illustrates the configuration of the array substrate 2 in a simplified manner, and schematically illustrates the photodiode 30 and a protective film 29 (organic protective film) covering the photodiode 30.

As illustrated in FIG. 6, the optical filter 7 includes the first light-blocking layer 71, the second light-blocking layer 72, a filter layer 73, the first light-transmitting resin layer 74, the second light-transmitting resin layer 75, and the lens 78. In the present embodiment, the first light-blocking layer 71, the filter layer 73, the first light-transmitting resin layer 74, the second light-blocking layer 72, the second light-transmitting resin layer 75, and the lens 78 are stacked on the protective film 29 in the order as listed.

FIG. 6 illustrates an enlarged view of a region provided with one of the lenses 78. However, as described above, each of the regions overlapping the respective photodiodes 30 is provided with more than one lenses 78, more than one first opening OP1, and more than one second opening OP2. The lens 78 is a convex lens. An optical axis CL of the lens 78 is provided parallel to the third direction Dz and intersects the photodiode 30. The lens 78 is provided directly on the second light-transmitting resin layer 75 so as to be in contact therewith. In the present embodiment, no light-blocking layer or the like is provided on the second light-transmitting resin layer 75 between the adjacent lenses 78.

The first light-blocking layer 71 is provided directly on the protective film 29 of the array substrate 2 so as to be in contact therewith. In other words, the first light-blocking layer 71 is provided between the photodiode 30 and the lens 78 in the third direction Dz. The first opening OP1 is provided in a region of the first light-blocking layer 71 overlapping the photodiode 30. The first opening OP1 is formed in a region overlapping the optical axis CL.

The first light-blocking layer 71 is provided directly on the protective film 29 of the array substrate 2 so as to be in contact therewith. The first light-blocking layer 71 is formed of, for example, a metal material such as molybdenum (Mo). This configuration allows the first light-blocking layer 71 to reflect components of light L2 that travel in oblique directions other than the light L2 that passes through the first opening OP1. Since the first light-blocking layer 71 is formed of a metal material, a width W1 in the first direction Dx (diameter) of the first opening OP1 can be accurately formed. Thus, even when the arrangement pitch and the area of the photodiode 30 are small, the first opening OP1 can be provided so as to correspond to the photodiode 30.

The first light-blocking layer 71 is processed to form the first opening OP1 in a metal material deposited by, for example, being sputtered onto the protective film 29 of the array substrate 2, and the optical filter 7 differs from what is called an external optical filter attached to the protective film 29 of the array substrate 2. However, the optical filter 7 is not limited to this configuration and may have a configuration of being provided as an external optical filter attached to the array substrate 2 with an adhesive layer (not illustrated) interposed therebetween. Since the first openings OP1 are provided in the arrangement direction D1 at an angle to the first direction Dx, the irregularity in the arrangement of the first openings OP1 is maintained even if positional misalignment occurs when the optical filter 7 is attached.

In addition, unlike the second light-blocking layer 72 described later formed of a resin material, the first light-blocking layer 71 is formed of a metal material. Therefore, the first light-blocking layer 71 can be formed to be thinner than the second light-blocking layer 72, and the first opening OP1 can be formed to be smaller than each of the second openings OP2 formed in the second light-blocking layer 72. The thickness of the first light-blocking layer 71 is equal to or less than one-tenth the thickness of the second light-blocking layer 72. As an example, the thickness of the first light-blocking layer 71 is 0.055 μm or greater, for example, 0.065 μm; and the thickness of the second light-blocking layer is, for example, 1 μm. The first light-blocking layer 71 is formed to be greatly thinner than the second light-blocking layer 72.

The filter layer 73 is provided directly on the first light-blocking layer 71 so as to be in contact therewith. In other words, the filter layer 73 is provided between the first light-blocking layer 71 and the first light-transmitting resin layer 74 in the third direction Dz. The filter layer 73 is a filter that blocks light in a predetermined wavelength band. The filter layer 73 is, for example, an infrared (IR) cut-off filter that is formed of a resin material colored in green and blocks infrared rays. With this configuration, the optical filter 7 can improve detection sensitivity by allowing components of the light L2 in the wavelength band required, for example, for fingerprint detection, to enter the photodiode 30.

The first light-transmitting resin layer 74 is provided directly on the filter layer 73 so as to be in contact therewith. In other words, the first light-transmitting resin layer 74 is provided between the first light-blocking layer 71 and the second light-blocking layer 72 in the third direction Dz. The first light-transmitting resin layer 74 and the second light-transmitting resin layer 75 are formed of a light-transmitting acrylic resin, for example.

The second light-blocking layer 72 is provided directly on the first light-transmitting resin layer 74 so as to be in contact therewith. In other words, the second light-blocking layer 72 is provided between the first light-blocking layer 71 and the lens 78 in the third direction Dz. The second light-blocking layer 72 is provided with the second opening OP2 in a region overlapping the photodiode 30 and the first opening OP1. The second opening OP2 is formed in a region overlapping the optical axis CL. More preferably, the centers of the second opening OP2 and the first opening OP1 are provided so as to overlap the optical axis CL.

The second light-blocking layer 72 is formed of, for example, a resin material colored in black. With this configuration, the second light-blocking layer 72 serves as a light-absorbing layer that absorbs components of the light L2 that travel in oblique directions other than the light L2 that passes through the second opening OP2. The second light-blocking layer 72 absorbs light reflected by the first light-blocking layer 71. With this configuration, as compared with a configuration in which the second light-blocking layer 72 is formed of a metal material, the light reflected by the first light-blocking layer 71 can be restrained from being repeatedly reflected a plurality of times, traveling in the first light-transmitting resin layer 74 as stray light, and entering the other photodiodes 30. The second light-blocking layer 72 can also absorb outside light that is incident from between the adjacent lenses 78. As a result, as compared with the configuration in which the second light-blocking layer 72 is formed of a metal material, reflected light can be reduced in the second light-blocking layer 72. However, the second light-blocking layer 72 is not limited to the example of being formed of a resin material colored in black, and may be formed of a metal material having blackened surfaces.

The second light-transmitting resin layer 75 is provided directly on the second light-blocking layer 72 so as to be in contact therewith. In other words, the second light-transmitting resin layer 75 is provided between the second light-blocking layer 72 and the lens 78.

The second light-transmitting resin layer 75 is formed using the same material as that of the first light-transmitting resin layer 74, and the refractive index of the second light-transmitting resin layer 75 is substantially equal to that of the first light-transmitting resin layer 74. As a result, the light L2 can be restrained from being reflected on an interface between the first light-transmitting resin layer 74 and the second light-transmitting resin layer 75 in the second opening OP2. However, the first light-transmitting resin layer 74 and the second light-transmitting resin layer 75 are not limited to this configuration and may be formed of different materials, and the refractive index of the first light-transmitting resin layer 74 may differ from that of the second light-transmitting resin layer 75.

In the present embodiment, a width W3 in the first direction Dx (diameter) of the lens 78, a width W2 in the first direction Dx (diameter) of the second opening OP2, and the width W1 in the first direction Dx (diameter) of the first opening OP1 decrease in this order. The width W1 is 2 μm to 10 μm, for example, approximately 3.5 μm. The width W2 is 3 μm to 20 μm, for example, approximately 10.0 μm. The width W3 is 10 μm to 50 μm, for example, approximately 21.9 μm.

A thickness t2 of the second light-transmitting resin layer 75 illustrated in FIG. 6 is made substantially equal to a thickness t1 of the first light-transmitting resin layer 74, or is made less than the thickness t1 of the first light-transmitting resin layer 74. The thickness t1 of the first light-transmitting resin layer 74 and the thickness t2 of the second light-transmitting resin layer 75 are made greater than a thickness t4 of the filter layer 73. The thickness t1 of the first light-transmitting resin layer 74 and the thickness t2 of the second light-transmitting resin layer 75 are larger than a thickness t3 of the protective film 29 of the array substrate 2. The thicknesses t1 and t2 are 3 μm to 30 μm, and for example, the thickness t1 is approximately 18 μm. The thickness t2 is, for example, approximately 16.5 μm. The thickness t3 is 1 μm to 10 μm, for example, 4.5 μm or larger. The thickness t4 of the filter layer 73, as an example, is 1 μm to 5 μm, for example, 1.35 μm.

With such a configuration, among the light L reflected by the object to be detected, such as the finger Fg, light L2-1 traveling in the third direction Dz is condensed by the lens 78 and enters the photodiode 30 through the second opening OP2 and the first opening OP1. Light L2-2 inclined at an angle θ1 with respect to the third direction Dz also enters the photodiode 30 through the second opening OP2 and the first opening OP1.

The film thickness of each of the layers of the optical filter 7, the width W1 of the first opening OP1, and the width W2 of the second opening OP2 can be changed as appropriate depending on the characteristics required of the optical filter 7.

Figure 7:
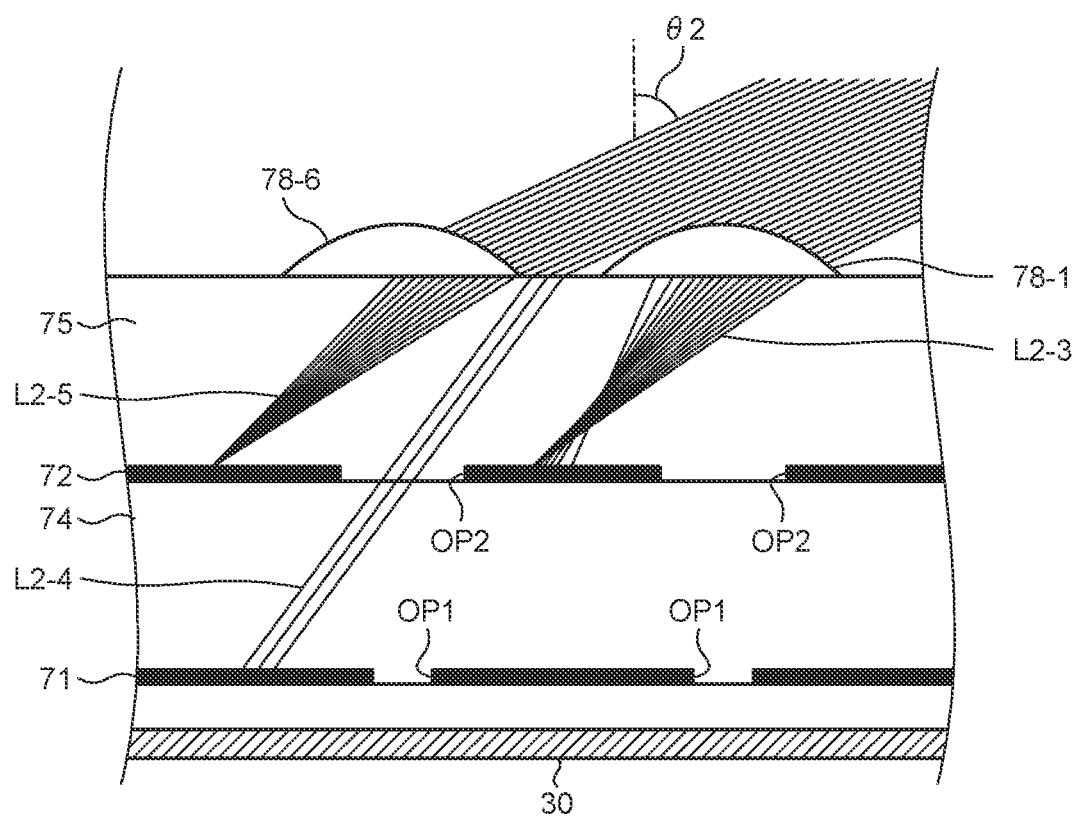
FIG. 7 is an explanatory diagram for schematically explaining traveling of light when the light is incident in an oblique direction on the optical filter.

FIG. 7 is an explanatory diagram for schematically explaining traveling of light when the light is incident in an oblique direction on the optical filter. FIG. 7 schematically illustrates a sectional structure of two adjacent lenses 78-1 and 78-6. Each of the lenses 78-1 and 78-6 is provided in a position overlapping the photodiode 30. FIG. 7 illustrates a case where the light L2 traveling in a direction at an angle to the third direction Dz is incident on the optical filter 7. In the example illustrated in FIG. 7, an angle θ2 formed by the light L2 and the third direction Dz is 65°.

As illustrated in FIG. 7, the light L2 incident in the oblique direction on the lenses 78-1 and 78-6 is condensed as light L2-3 and L2-5, respectively, and is blocked by the second light-blocking layer 72. The light L2 incident on the second light-transmitting resin layer 75 between the adjacent lenses 78 is refracted on the upper surface of the second light-transmitting resin layer 75 and travels as light L2-4 in the second light-transmitting resin layer 75. Part of the light L2-4 is blocked by the second light-blocking layer 72. A component of the light L2-4 transmitted through the second opening OP2 is blocked by the first light-blocking layer 71.

Thus, by being provided with the first light-blocking layer 71 and the second light-blocking layer 72, the optical filter 7 can effectively block the light L2 incident from the oblique direction and reduce occurrence of what is called crosstalk, as compared with a case where the optical filter 7 is formed with only one light-blocking layer (for example, a case where the optical filter 7 is formed with only the first light-blocking layer 71 and without the second light-blocking layer 72 in FIG. 7).

Even when the first light-blocking layer 71 and the second light-blocking layer 72 are provided, the light L2 incident in a direction parallel to the third direction Dz is restrained from being blocked by the first light-blocking layer 71 and the second light-blocking layer 72, and thus, can efficiently enter the photodiode 30. As described above, the detection device 1 can reduce the occurrence of the crosstalk to improve the detection accuracy.

The optical filter 7 is integrally formed with the array substrate 2. That is, the first light-blocking layer 71 of the optical filter 7 is provided directly on the protective film 29 so as to be in contact therewith, and no member such as an adhesive layer is provided between the first light-blocking layer 71 and the protective film 29. Since the optical filter 7 is formed as a film directly on the array substrate 2 and undergoing a process such as patterning, the positional accuracy of the first opening OP1, the second opening OP2, and the lens 78 of the optical filter 7 with respect to the photodiode 30 can be more improved than in a case where the optical filter 7 is attached as a separate body to the array substrate 2. However, the optical filter 7 is not limited to this configuration, and may be what is called an external optical filter attached onto the protective film 29 of the array substrate 2 with an adhesive layer interposed therebetween.

The optical filter 7 is not limited to the configuration including the first light-blocking layer 71 and the second light-blocking layer 72, and may be formed to have one light-blocking layer. The filter layer 73 is provided between the first light-blocking layer 71 and the first light-transmitting resin layer 74, but the position of the filter layer 73 is not limited thereto. The position of the filter layer 73 can be changed as appropriate depending on the characteristics required of the optical filter 7 and the manufacturing process.

Figure 8:
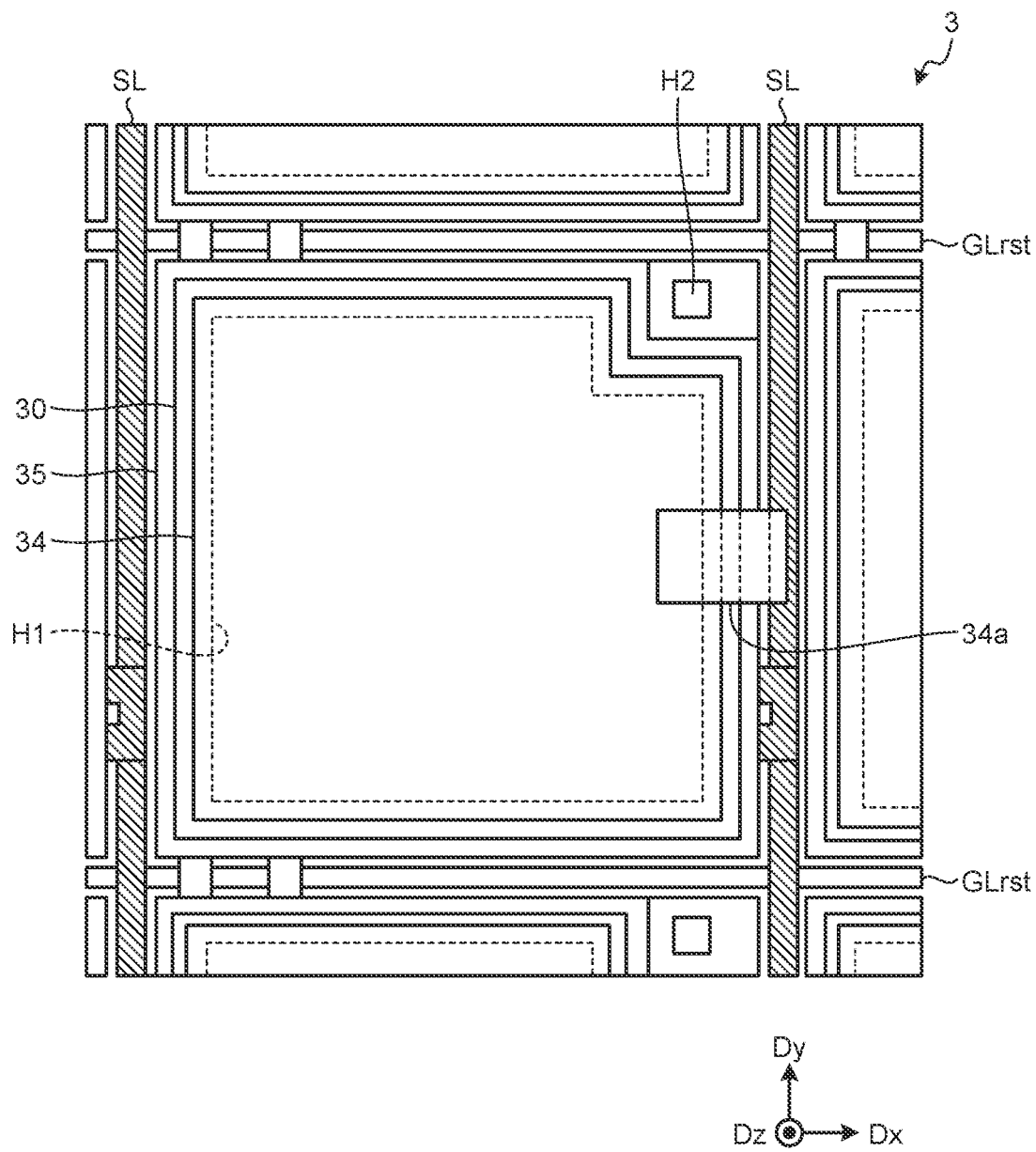
FIG. 8 is a plan view schematically illustrating a photodiode of the detection element.

The following describes a planar configuration of the photodiode 30. FIG. 8 is a plan view schematically illustrating the photodiode of the detection element. As illustrated in FIG. 8, the photodiode 30 is provided in a region surrounded by two reset control scan lines GLrst adjacent to each other in the second direction Dy and two output signal lines SL adjacent to each other in the first direction Dx. In the present embodiment, each of the detection elements 3 is defined by a region surrounded by two scan lines (for example, the reset control scan lines GLrst) adjacent to each other in the second direction Dy and two signal lines (for example, the output signal lines SL) adjacent to each other in the first direction Dx.

The reset control scan lines GLrst extend in the first direction Dx. The output signal lines SL extend in the second direction Dy while intersecting the reset control scan lines GLrst. In other words, in each of the regions overlapping the respective photodiodes 30, the arrangement direction D1 of the lenses 78 and the first openings OP1 (refer to FIG. 5) is at an angle to the extension direction of the scan lines (for example, the reset control scan lines GLrst).

The photodiode 30 is formed so as to cover most of the region of the detection element 3. The photodiode 30 is provided so as to cover the circuit elements (not illustrated in FIG. 8) such as the reset transistor Mrst, the read transistor Mrd, and the source follower transistor Msf included in the detection element 3 (refer to FIG. 4).

The upper electrode 34 and the lower electrode 35 face each other in the third direction Dz with the photodiode 30 interposed therebetween. Specifically, the photodiode 30 is disposed above the array substrate 2 provided with various types of wiring and various transistors with the lower electrode 35 interposed between the photodiode 30 and the array substrate 2.

The lower electrode 35 is electrically coupled to the reset transistor Mrst and the source follower transistor Msf through a contact hole H2 at a portion not overlapping the photodiode 30 and the upper electrode 34. The upper electrode 34 is electrically coupled to the photodiode 30 through a contact hole H1. The contact hole H1 provided in an insulating film 27 (refer to FIG. 14) is provided so as to overlap most of the region of the upper electrode 34, and the insulating film 27 overlaps the upper electrode 34 at a peripheral portion of the upper electrode 34. The upper electrode 34 is coupled to reference potential supply wiring SLcom (not illustrated in FIG. 8) through coupling wiring 34a. The reference potential supply wiring SLcom is wiring that supplies the reference potential VCOM to the photodiode 30 and is provided, for example, so as to extend in the second direction Dy while overlapping the output signal line SL.

The configuration of the photodiode 30 is merely an example, and the shape, area, or the like thereof can be changed as appropriate depending on the characteristics required of the detection device 1.

As described above, the detection device 1 of the present embodiment includes the substrate 21, the photodiodes 30 provided to the substrate 21 and arranged in the first direction Dx, the lenses 78 provided so as to overlap the photodiodes 30, and the first light-blocking layer 71 that is provided between the photodiodes 30 and the lenses 78 and has the first openings OP1. More than one of the first openings OP1 is provided in each of the regions overlapping the respective photodiodes 30, and the arrangement direction D1 of the first openings OP1 in each of the regions overlapping the respective photodiodes 30 is at an angle to the first direction Dx.

Thus, with such a configuration, the lenses 78 and the first openings OP1 of the optical filter 7 are irregularly arranged in the arrangement direction Dpd of the photodiodes 30. Therefore, even when the periodic regularity is present in the arrangement relation between the photodiodes 30 and the sub-pixels SPX of the display device 100 provided above the detection device 1, the detection device 1 can reduce the generation of the moiré pattern (unintended pattern such as a striped distribution of light) in the light that is incident on the photodiodes 30 through the optical filter 7.

First Modification

Figure 9:
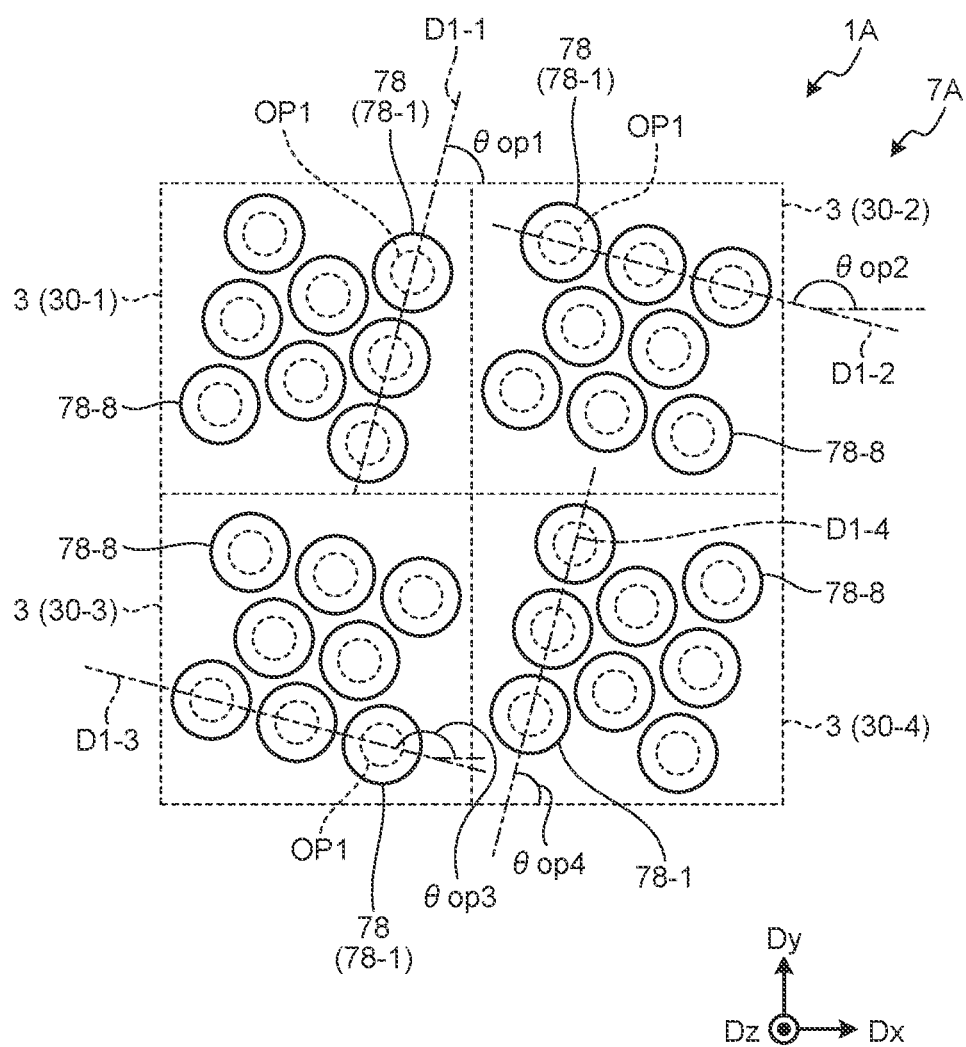
FIG. 9 is a plan view illustrating an optical filter according to a first modification.

FIG. 9 is a plan view illustrating an optical filter according to a first modification. In the first embodiment described above, the lenses 78 and the first openings OP1 are formed in the same arrangement pattern in each of the detection elements 3 (photodiodes 30). However, the lenses 78 and the first openings OP1 are not limited to being thus formed and may be formed in arrangement patterns different between the detection elements 3.

To make the explanation easier to understand, FIG. 9 illustrates two rows and two columns making a total of four detection elements 3. The photodiodes 30 of the respective detection elements 3 are denoted as a first photodiode 30-1, a second photodiode 30-2, a third photodiode 30-3, and a fourth photodiode 30-4. However, in the following description, the first photodiode 30-1, the second photodiode 30-2, the third photodiode 30-3, and the fourth photodiode 30-4 are each simply referred to as the photodiode 30 when they need not be distinguished from one another.

As illustrated in FIG. 9, in an optical filter 7A of a detection device 1A according to the first modification, the first photodiode 30-1 is adjacent to the second photodiode 30-2 in the first direction Dx. The third photodiode 30-3 is adjacent to the first photodiode 30-1 in the second direction Dy. The fourth photodiode 30-4 is adjacent to the third photodiode 30-3 in the first direction Dx.

Each arrangement pattern of the lenses 78 and the first openings OP1 that overlap a corresponding one of the photodiodes 30 is arranged so as to be rotated by 90° from one another. More specifically, an arrangement direction D1-1 of the lenses 78 and the first openings OP1 in a region overlapping the first photodiode 30-1 intersects (orthogonally intersects) an arrangement direction D1-2 of the lenses 78 and the first openings OP1 in a region overlapping the second photodiode 30-2. An angle θop2 formed between the arrangement direction D1-2 and the first direction Dx in the region overlapping the second photodiode 30-2 is represented as θop2=θop1+90° as compared with an angle θop1 formed between the arrangement direction D1-1 and the first direction Dx in the region overlapping the first photodiode 30-1.

In the same manner, an arrangement direction D1-4 of the lenses 78 and the first openings OP1 in a region overlapping the fourth photodiode 30-4 intersects (orthogonally intersects) the arrangement direction D1-2 of the lenses 78 and the first openings OP1 in the region overlapping the second photodiode 30-2. An arrangement direction D1-3 of the lenses 78 and the first openings OP1 in a region overlapping the third photodiode 30-3 intersects (orthogonally intersects) the arrangement direction D1-4 of the lenses 78 and the first openings OP1 in the region overlapping the fourth photodiode 30-4.

The arrangement patterns of the lenses 78 and the first openings OP1 are arranged such that each of the arrangement patterns is rotated by 90° in clockwise order (in the order of the first photodiode 30-1, the second photodiode 30-2, the fourth photodiode 30-4, and the third photodiode 30-3) with respect to the center of the four detection elements 3. That is, angles θop1, θop2, θop4, and θop3 of the arrangement directions D1-1, D1-2, D1-4, and D1-3 are provided such that the arrangement pattern is sequentially rotated by 90°.

FIG. 9 illustrates the four detection elements 3 (photodiodes 30). In the detection region AA, the four detection elements 3 (photodiodes 30) are arranged in a matrix in which a combination of the four detection elements 3 (photodiodes 30) is set to be one unit.

With such a configuration, in the first modification, the lenses 78 and the first openings OP1 of the optical filter 7A are irregularly arranged in the adjacent detection elements 3 (photodiodes 30). That is, the irregularity of the arrangement pattern of the lenses 78 and the first openings OP1 of the optical filter 7A can be increased in a region wider than that in the first embodiment. Therefore, the detection device 1A of the first modification can reduce the generation of the moiré pattern in the light that is incident on the photodiodes 30 through the optical filter 7A.

Second Modification

Figure 10:
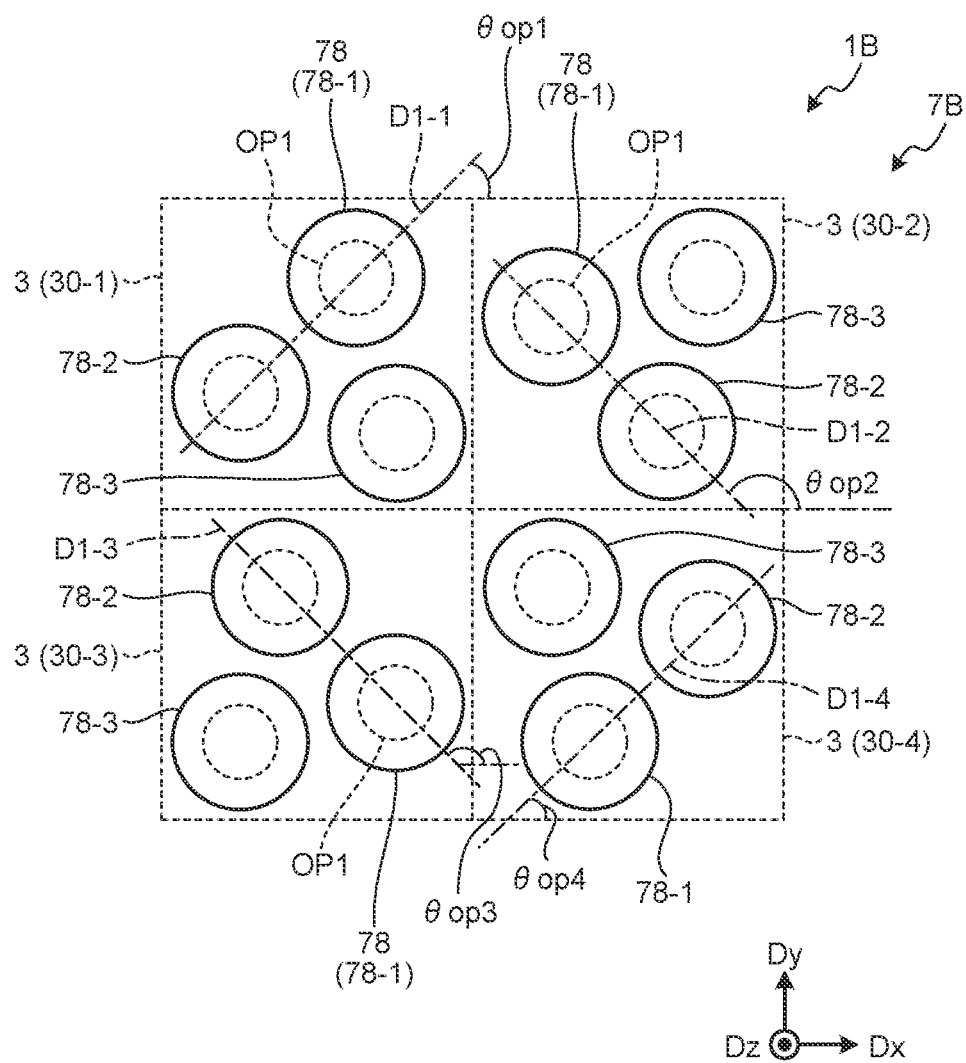
FIG. 10 is a plan view illustrating an optical filter according to a second modification.

FIG. 10 is a plan view illustrating an optical filter according to a second modification. In the first embodiment and the first modification described above, eight of the lenses 78 and eight of the first openings OP1 are provided so as to overlap each of the detection elements 3 (photodiodes 30). However, the number of the lenses 78 and the number of the first openings OP1 are not limited thereto and may be seven or smaller, or nine or larger.

As illustrated in FIG. 10, in an optical filter 7B of a detection device 1B according to the second modification, three of the lenses 78 and three of the first openings OP1 overlapping therewith are provided in each of the regions overlapping the respective photodiodes 30. The three lenses 78 and the three first openings OP1 are disposed in vertex positions of a triangle.

Also, in the present modification, the arrangement direction D1 of the lenses 78 and the first openings OP1 is also at an angle to the first direction Dx (arrangement direction Dpd of the photodiodes 30). In more detail, in the region overlapping the first photodiode 30-1, the arrangement direction D1-1 of the two adjacent lenses 78-1, 78-2 and the two first openings OP1 overlapping therewith is inclined at the angle θop1 with respect to the first direction Dx. The arrangement direction D1 (not illustrated) of the two adjacent lenses 78-2, 78-3 and the two first openings OP1 overlapping therewith is also inclined with respect to the first direction Dx. The arrangement direction D1 (not illustrated) of the two adjacent lenses 78-1, 78-3 and the two first openings OP1 overlapping therewith is also inclined with respect to the first direction Dx.

The arrangement pattern of the lenses 78 and the first openings OP1 that overlap one of the photodiodes 30 and the arrangement pattern of the lenses 78 and the first openings OP1 that overlap another one of the photodiodes 30 adjacent to the one photodiode 30 are arranged so as to be rotated by 90° from each other. The relation between the arrangement patterns of the lenses 78 and the first openings OP1 in the four adjacent photodiodes 30 is the same as that in the first modification described above, and the description thereof will not be repeated.

The second modification can be combined with the first embodiment described above. That is, the three lenses 78-1, 78-2, 78-3 and the first openings OP1 may be formed in the same arrangement pattern in the detection elements 3 (photodiodes 30).

Second Embodiment

Figure 11:
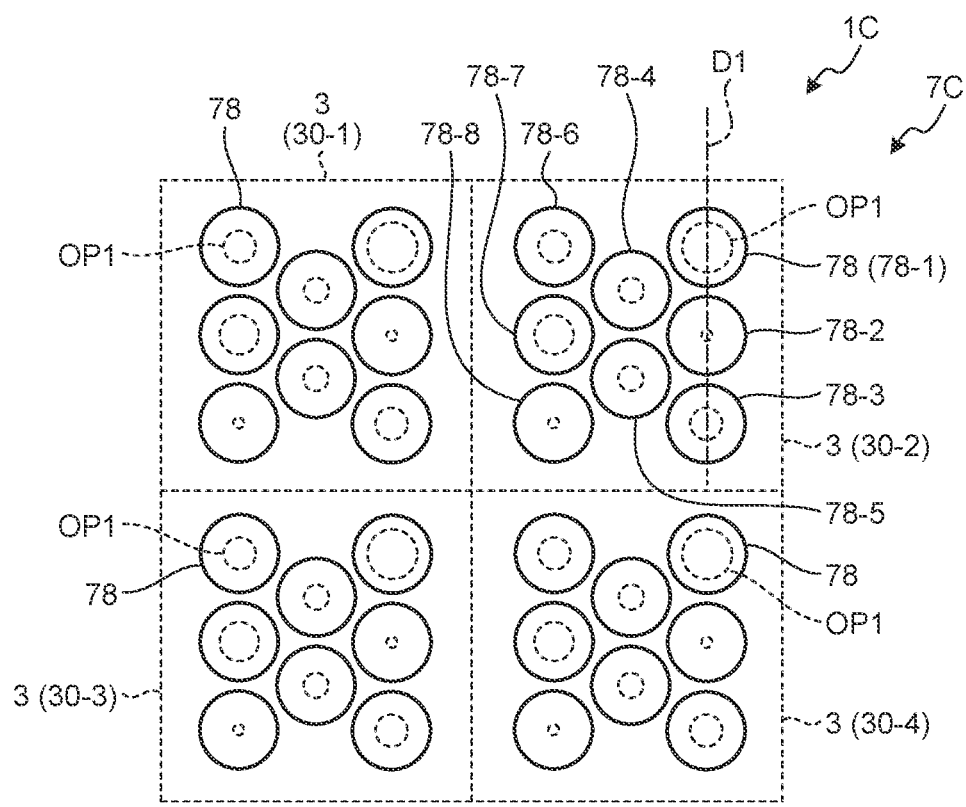
FIG. 11 is a plan view illustrating an optical filter included in a detection device according to a second embodiment.
Figure 11:
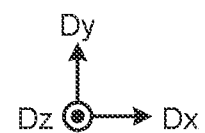

FIG. 11 is a plan view illustrating an optical filter included in a detection device according to a second embodiment. As illustrated in FIG. 11, an optical filter 7C included in a detection device 1C according to the second embodiment has a different configuration in which the diameters of the first openings OP1 are irregularly formed. That is, the first openings OP1 are provided in each of the regions overlapping the respective photodiodes 30, and the diameter of at least one of the first openings OP1 in each of the regions overlapping the respective photodiodes 30 differs from the diameters of the other openings.

For example, the diameter of the first opening OP1 overlapping the lens 78-1 is greater than the diameter of the first opening OP1 overlapping the lens 78-2. The diameter of the first opening OP1 overlapping the lens 78-3 is greater than the diameter of the first opening OP1 overlapping the lens 78-2 and less than the diameter of the first opening OP1 overlapping the lens 78-1. The diameter of the first opening OP1 overlapping the lens 78-4 is equal to the diameter of the first opening OP1 overlapping the lens 78-5. The diameter of the first opening OP1 overlapping the lens 78-6 is less than the diameter of the first opening OP1 overlapping the lens 78-7 and greater than the diameter of the first opening OP1 overlapping the lens 78-8.

In the second embodiment, in each of the regions overlapping the respective photodiodes 30, the arrangement direction D1 of the lenses 78 and the first openings OP1 is parallel to the second direction Dy. The lenses 78 and the first openings OP1 are formed in the same arrangement pattern in each of the detection elements 3 (photodiodes 30).

That is, the arrangement pattern of the lenses 78 and the first openings OP1 is more regular in the arrangement directions (first direction Dx and second direction Dy) of the photodiodes 30 than in the first embodiment, the first modification, and the second modification described above.

Even with such an arrangement pattern, the first openings OP1 are formed to have irregularly different diameters. Therefore, even when the arrangement relation between the photodiodes 30 and the sub-pixels SPX has periodic regularity, the moiré pattern can be restrained from occurring in the light that is incident on the photodiodes 30 through the first openings OP1 of an optical filter 7C.

The configuration of the second embodiment can be combined with the first embodiment, the first modification, and the second modification described above. That is, in each of the regions overlapping the respective photodiodes 30, the arrangement direction D1 of the lenses 78 and the first openings OP1 may be inclined with respect to the first direction Dx, and the diameters of the first openings OP1 may be irregularly formed. In the detection elements 3 (photodiodes 30), the lenses 78 and the first openings OP1 may be formed in arrangement patterns rotated by 90° from one another, and the diameters of the first openings OP1 may be irregularly formed. In addition, the number of the lenses 78 and the number of the first openings OP1 in each of the regions overlapping the respective photodiodes 30 may be three to seven, or nine or larger.

Third Embodiment

Figure 12:
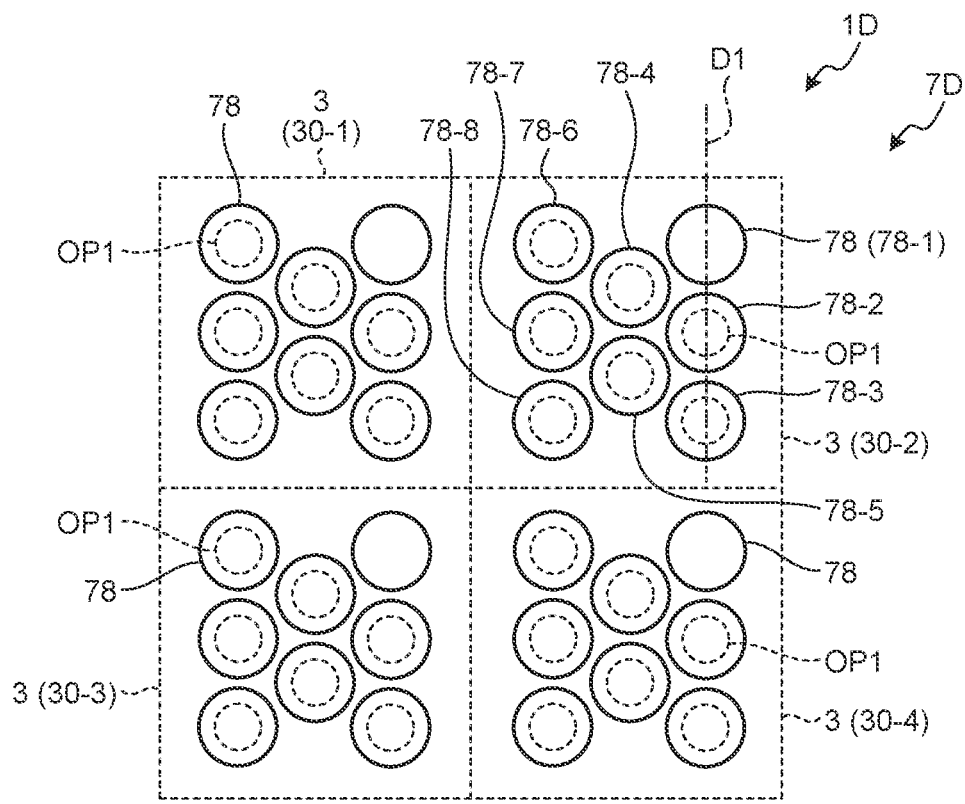
FIG. 12 is a plan view illustrating an optical filter included in a detection device according to a third embodiment.

FIG. 12 is a plan view illustrating an optical filter included in a detection device according to a third embodiment. As illustrated in FIG. 12, an optical filter 7D of a detection device 1D according to the third embodiment is not provided with a first opening OP1 overlapping the lens 78-1. That is, the first light-blocking layer 71 (FIG. 6) is continuously formed in a region overlapping the lens 78-1. The first opening OP1 is formed in each of regions overlapping the respective lenses 78-2 to 78-8. In the present embodiment, the first openings OP1 are provided in each of the regions overlapping the respective photodiodes 30, and the number of the first openings OP1 differs from the number of the lenses 78.

The lens 78-1 need not be provided in a region where the first opening OP1 is not formed. In the third embodiment, in the same manner as in the second embodiment described above, in each of the regions overlapping the respective photodiodes 30, the arrangement direction D1 of the lenses 78 and the first openings OP1 is parallel to the second direction Dy. The lenses 78 and the first openings OP1 are formed in the same arrangement pattern in each of the detection elements 3 (photodiodes 30).

In the present embodiment, the number of the first openings OP1 lined up in a straight line in the arrangement direction D1 is smaller than that in the configuration in which the first opening OP1 is provided so as to overlap the lens 78-1, that is, in the configuration in which three of the first openings OP1 are arranged in the arrangement direction D1. As a result, the irregularity of the arrangement of the first openings OP1 can be improved in the arrangement direction D1 overlapping the lens 78-1.

The position provided with no first opening OP1 may be any of the regions overlapping the lenses 78-2 to 78-8, or the number of regions provided with no first opening OP1 may be two or larger.

The configuration of the third embodiment can be combined with the first embodiment, the second embodiment, the first modification, and the second modification described above. That is, in each of the regions overlapping the respective photodiodes 30, the arrangement direction D1 of the lenses 78 and the first openings OP1 may be inclined with respect to the first direction Dx, and at least one of the first openings OP1 overlapping the lenses 78 need not be formed. In the detection elements 3 (photodiodes 30), the lenses 78 and the first openings OP1 may be formed in arrangement patterns rotated by 90° from one another, and at least one of the first openings OP1 overlapping the lenses 78 need not be formed. In addition, the number of the lenses 78 and the number of the first openings OP1 in each of the regions overlapping the respective photodiodes 30 may be three to seven, or nine or larger.

Fourth Embodiment

Figure 13:
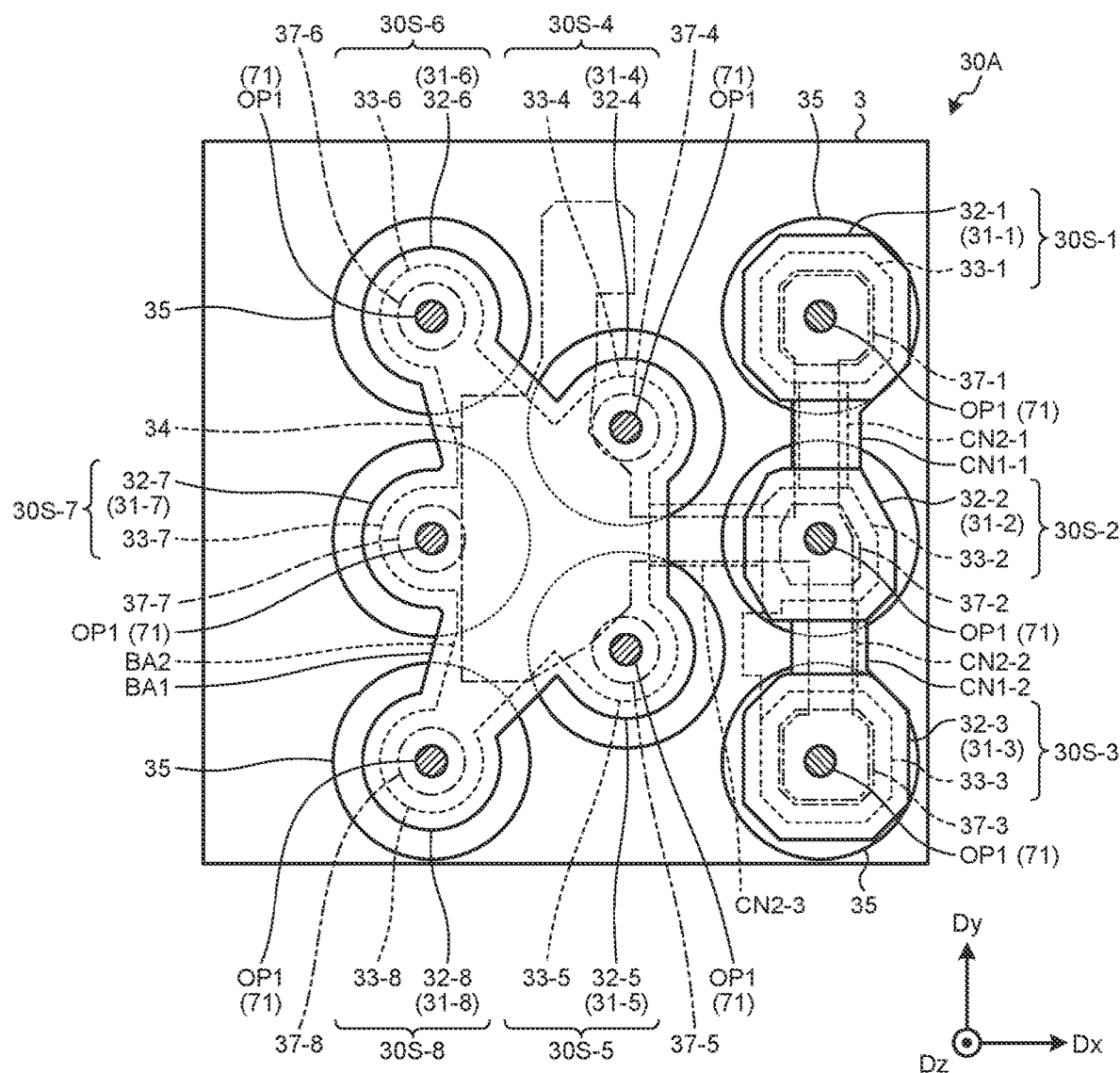
FIG. 13 is a plan view schematically illustrating a photodiode according to a fourth embodiment.

FIG. 13 is a plan view schematically illustrating a photodiode according to a fourth embodiment. For ease of viewing, FIG. 13 does not illustrate a plurality of transistors included in the detection element 3 and various types of wiring such as the scan lines and the signal lines.

As illustrated in FIG. 13, a photodiode 30A includes a plurality of partial photodiodes 30S-1, 30S-2, . . . , 30S-8. The partial photodiodes 30S-1, 30S-2, . . . , 30S-8 are arranged in a triangular grid pattern. The arrangement of the partial photodiodes 30S-1, 30S-2, . . . , 30S-8 illustrated in FIG. 13 can be applied to the detection device 1C of the second embodiment (refer to FIG. 11). The lenses 78-1, 78-2, . . . , 78-8, the first openings OP1 of the first light-blocking layer 71, and the second openings OP2 of the second light-blocking layer 72 illustrated in FIG. 13 are provided so as to overlap the respective partial photodiodes 30S-1, 30S-2, . . . , 30S-8.

As illustrated in FIG. 13, the partial photodiodes 30S-1, 30S-2, and 30S-3 are arranged in the second direction Dy. The partial photodiodes 30S-4 and 30S-5 are arranged in the second direction Dy, and are adjacent in the first direction Dx to an element column made up of the partial photodiodes 30S-1, 30S-2, and 30S-3. The partial photodiodes 30S-6, 30S-7, and 30S-8 are arranged in the second direction Dy, and are adjacent in the first direction Dx to an element column made up of the partial photodiodes 30S-4 and 30S-5. The positions in the second direction Dy of the partial photodiodes 30S are arranged in a staggered manner between the adjacent element columns.

The light L is incident on the partial photodiodes 30S-1, 30S-2, . . . , 30S-8 through the lenses 78-1, 78-2, . . . , 78-8, respectively, and the first and the second openings OP1 and OP2. The partial photodiodes 30S-1, 30S-2, . . . , 30S-8 are electrically coupled together to serve as one photodiode 30A. That is, signals output by the partial photodiodes 30S-1, 30S-2, . . . , 30S-8 are integrated to output one detection signal Vdet from the photodiode 30A. In the following description, the partial photodiodes 30S-1, 30S-2, . . . , 30S-8 are each simply referred to as a partial photodiode 30S when they need not be distinguished from one another.

Each of the partial photodiodes 30S includes an i-type semiconductor layer 31, an n-type semiconductor layer 32, and a p-type semiconductor layer 33. The i-type semiconductor layer 31 and the n-type semiconductor layer 32 are formed of, for example, amorphous silicon (a-Si). The p-type semiconductor layer 33 is formed of, for example, polysilicon (p-Si). The material of the semiconductor layers is not limited thereto and may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor and has lower conductivity than that of the n-type semiconductor layer 32 and the p-type semiconductor layer 33.

FIG. 11 uses a long dashed short dashed line to illustrate an effective sensing region 37 in which the p-type semiconductor layer 33 is coupled to the i-type semiconductor layer 31 (n-type semiconductor layer 32). The first opening OP1 of the first light-blocking layer 71 is provided so as to overlap the sensing region 37.

The partial photodiodes 30S have shapes different from one another in the plan view. Each of the partial photodiodes 30S-1, 30S-2, and 30S-3 is formed in a polygonal shape. Each of the partial photodiodes 30S-4, 30S-5, 30S-6, 30S-7, and 30S-8 is formed in a circular or semicircular shape.

The n-type semiconductor layers 32 of the partial photodiodes 30S-1, 30S-2, and 30S-3 arranged in the second direction Dy are electrically coupled together by joints CN1-1 and CN1-2. The p-type semiconductor layers 33 of the partial photodiodes 30S-1, 30S-2, and 30S-3 are electrically coupled together by joints CN2-1 and CN2-2.

The n-type semiconductor layers 32 (i-type semiconductor layers 31) of the partial photodiodes 30S-4, 30S-5, 30S-6, 30S-7, and 30S-8 are electrically coupled together by a base BA1. The p-type semiconductor layers 33 of the partial photodiodes 30S-4, 30S-5, 30S-6, 30S-7, and 30S-8 are electrically coupled together by a base BA2. The bases BA1 and BA2 are each formed in a substantially pentagonal shape, and are provided, at the vertex positions, with the partial photodiodes 30S-4, 30S-5, 30S-6, 30S-7, and 30S-8. The base BA2 is electrically coupled to the p-type semiconductor layers 33 of the partial photodiodes 30S-1, 30S-2, and 30S-3 by a joint CN2-3. This configuration electrically couples together the partial photodiodes 30S constituting each of the photodiodes 30A.

Each of the lower electrode 35 is provided in a region overlapping a corresponding one of the partial photodiodes 30S. All the lower electrodes 35 are circular in the plan view. That is, the lower electrode 35 may have a different shape from that of the partial photodiode 30S. For example, each of the partial photodiodes 30S-1, 30S-2, and 30S-3 has a polygonal shape in the plan view, and is formed on the circular lower electrode 35. Each of the partial photodiodes 30S-4, 30S-5, 30S-6, 30S-7, and 30S-8 has a circular or semicircular shape having a smaller diameter than that of the lower electrode 35 in the plan view, and is formed on the circular lower electrode 35. The lower electrode 35 is supplied with the same reference potential VCOM as that of the p-type semiconductor layer 33, whereby the parasitic capacitance between the lower electrode 35 and the p-type semiconductor layer 33 can be reduced.

The upper electrode 34 electrically couples together the n-type semiconductor layers 32 of the partial photodiodes 30S. The upper electrode 34 is electrically coupled to the transistors (reset transistor Mrst and source follower transistor Msf (refer to FIG. 4)) of the array substrate 2. The upper electrode 34 may be provided in any manner and may be provided, for example, so as to cover portions of the partial photodiodes 30S, or so as to cover the entire partial photodiodes 30S.

In the present embodiment, the partial photodiode 30S is provided for each set of the lenses 78 and the first openings OP1. With this configuration, as compared with a configuration in which the photodiode 30 is formed of a solid film having, for example, a quadrilateral shape so as to cover the entire detection element 3 in the plan view as illustrated in FIG. 8, the semiconductor layers and the wiring layers in a region not overlapping the lenses 78 nor the first openings OP1 can be reduced. Therefore, the parasitic capacitance of the photodiode 30A can be reduced.

The planar structure of the photodiode 30A illustrated in FIG. 13 is merely an example, and may be changed as appropriate. The number of the partial photodiodes 30S included in each of the photodiodes 30A may be seven or smaller, or nine or larger. The partial photodiodes 30S are not limited to being arranged in a triangular grid pattern, but may be arranged in a matrix having a row-column configuration, for example. The photodiode 30A illustrated in FIG. 13 can also be applied to the first embodiment, the third embodiment, the first modification, and the second modification. In this case, the partial photodiodes 30S-1, 30S-2, . . . , 30S-8 are arranged at an angle to the first direction Dx so as to correspond to the arrangement direction D1 of the lenses 78 and the first openings OP1.

FIG. 14 is a sectional view illustrating a schematic sectional configuration of the partial photodiode. FIG. 14 illustrates the sectional configuration of the reset transistor Mrst included in the detection element 3 together with the sectional configuration of one partial photodiode 30S-1. Each of the source follower transistor Msf and the read transistor Mrd included in the detection element 3 also has a sectional configuration similar to that of the reset transistor Mrst.

The substrate 21 is an insulating substrate, and a glass substrate of, for example, quartz or alkali-free glass, or a resin substrate of, for example, polyimide is used as the substrate 21. A gate electrode 64 is provided on the substrate 21. Insulating films 22 and 23 are provided on the substrate 21 so as to cover the gate electrode 64. The insulating films 22 and 23 and insulating films 24, 25, and 26 are inorganic insulating films, and are formed of, for example, silicon oxide ($SiO_2$) or silicon nitride (SiN).

A semiconductor layer 61 is provided on the insulating film 23. For example, polysilicon is used as the semiconductor layer 61. The semiconductor layer 61 is, however, not limited thereto, and may be formed of, for example, a microcrystalline oxide semiconductor, an amorphous oxide semiconductor, or low-temperature polycrystalline silicon (LTPS). The reset transistor Mrst has a bottom-gate structure in which the gate electrode 64 is provided on the lower side of the semiconductor layer 61, but may have a top-gate structure in which the gate electrode 64 is provided on the upper side of the semiconductor layer 61, or a dual-gate structure in which the gate electrodes 64 are provided on the upper side and lower side of the semiconductor layer 61.

The semiconductor layer 61 includes a channel region 61a, high impurity concentration regions 61b and 61c, and low impurity concentration regions 61d and 61e. The channel region 61a is, for example, a non-doped intrinsic semiconductor or a low-impurity region and has lower conductivity than that of the high impurity concentration regions 61b and 61c and the low impurity concentration regions 61d and 61e. The channel region 61a is provided in a region overlapping the gate electrode 64.

The insulating films 24 and 25 are provided on the insulating film 23 so as to cover the semiconductor layer 61. A source electrode 62 and a drain electrode 63 are provided on the insulating film 25. The source electrode 62 is coupled to the high impurity concentration region 61b of the semiconductor layer 61 through a contact hole H5. The drain electrode 63 is coupled to the high impurity concentration region 61c of the semiconductor layer 61 through a contact hole H3. The source electrode 62 and the drain electrode 63 are formed of, for example, a multilayered film of Ti—Al—Ti layers or Ti—Al layers that has a multilayered structure of titanium and aluminum.

A gate line GLsf is wiring coupled to the gate of the source follower transistor Msf. The gate line GLsf is provided in the same layer as that of the gate electrode 64. The drain electrode 63 is coupled to the gate line GLsf through a contact hole passing through the insulating films 22 to 25.

The following describes a sectional configuration of the photodiode 30A. The partial photodiode 30S-1 will be described with reference to FIG. 14. However, the description of the partial photodiode 30S-1 is also applicable to the other partial photodiodes 30S-2, ... , 30S-8. As illustrated in FIG. 14, the lower electrode 35 is provided in the same layer as that of the gate electrode 64 and the gate line GLsf on the substrate 21. The insulating films 22 and 23 are provided on the lower electrode 35. The photodiode 30A is provided on the insulating film 23. In other words, the lower electrode 35 is provided between the substrate 21 and the p-type semiconductor layer 33. The lower electrode 35 is formed of the same material as that of the gate electrode 64 to serve as a light-blocking layer, and thus, the lower electrode 35 can restrain light from entering the photodiode 30A from the substrate 21 side.

The i-type semiconductor layer 31 is provided between the p-type semiconductor layer 33 and the n-type semiconductor layer 32 in the third direction Dz. In the present embodiment, the p-type semiconductor layer 33, the i-type semiconductor layer 31, and the n-type semiconductor layer 32 are stacked on the insulating film 23 in the order as listed.

Specifically, the p-type semiconductor layer 33 is provided in the same layer as that of the semiconductor layer 61 on the insulating film 23. The insulating films 24, 25, and 26 are provided so as to cover the p-type semiconductor layer 33. The insulating films 24 and 25 are provided with a contact hole H13 in a position overlapping the p-type semiconductor layer 33. The insulating film 26 is provided on the insulating film 25 so as to cover the transistors including the reset transistor Mrst. The insulating film 26 covers side surfaces of the insulating films 24 and 25 constituting an inner wall of the contact hole H13. The insulating film 26 is provided with a contact hole H14 in a position overlapping the p-type semiconductor layer 33.

The i-type semiconductor layer 31 is provided on the insulating film 26 and is coupled to the p-type semiconductor layer 33 through the contact hole H14 passing through the insulating films 24 to 26. The n-type semiconductor layer 32 is provided on the i-type semiconductor layer 31.

The insulating film 27 is provided on the insulating film 26 so as to cover the photodiode 30A. The insulating film 27 is provided so as to directly contact the photodiode 30A and the insulating film 26. The insulating film 27 is formed of an organic material such as a photosensitive acrylic. The insulating film 27 is thicker than the insulating film 26. The insulating film 27 has a better step covering property than that of inorganic insulating materials and is provided so as to cover side surfaces of the i-type semiconductor layer 31 and the n-type semiconductor layer 32.

The upper electrode 34 is provided on the insulating film 27. The upper electrode 34 is formed of, for example, a light-transmitting conductive material such as indium tin oxide (ITO). The upper electrode 34 is provided along a surface of the insulating film 27 and is coupled to the n-type semiconductor layer 32 through the contact hole H1 provided in the insulating film 27. The upper electrode 34 is electrically coupled to the drain electrode 63 of the reset transistor Mrst and the gate line GLsf through the contact hole H2 provided in the insulating film 27.

An insulating film 28 is provided on the insulating film 27 so as to cover the upper electrode 34. The insulating film 28 is an inorganic insulating film. The insulating film 28 is provided as a protective layer for restraining water from entering the photodiode 30A. An overlapping conductive layer 36 is provided on the insulating film 28. The overlapping conductive layer 36 is formed of, for example, a light-transmitting conductive material such as ITO. The overlapping conductive layer 36 need not be provided.

The protective film 29 is provided on the insulating film 28 so as to cover the overlapping conductive layer 36. The protective film 29 is an organic protective film. The protective film 29 is formed so as to planarize a surface of the detection device 1.

In the present embodiment, the p-type semiconductor layer 33 of the photodiode 30A and the lower electrode 35 are provided in the same layers as those of the transistors. As a result, the manufacturing process can be simplified as compared with a case where the photodiode 30 is formed in layers different from those of the transistors.

The sectional configuration of the photodiode 30A illustrated in FIG. 14 is merely an example. The sectional configuration is not limited to this example. For example, the photodiode 30A may be provided in layers different from those of the transistors, and may be provided by stacking the p-type semiconductor layer 33, the i-type semiconductor layer 31, and the n-type semiconductor layer 32 on the insulating film 26 in the order as listed, in the same manner as the photodiode 30 illustrated in FIG. 8.

While the preferred embodiments of the present disclosure have been described above, the present disclosure is not limited to the embodiments described above. The content disclosed in the embodiments is merely exemplary, and can be variously changed within the scope not departing from the gist of the present disclosure. Any modification appropriately made within the scope not departing from the gist of the present disclosure also naturally belongs to the technical scope of the present disclosure. At least one of various omissions, replacements, and modifications of the components can be made without departing from the gist of the embodiments and the modifications described above.

For example, although the display device 100 and the detection device 1 have been described as separate devices in the embodiments, the detection device 1 can be added inside the display device 100. For example, a structure having the function of the detection device 1 may be added between a TFT substrate and a color filter substrate of the liquid crystal display device 100, or the detection device 1 may be formed on the TFT substrate of the OLED display device 100. In that case, the detection device 1 may be said to be a part of the display device 100.

What is claimed is:

1. A detection device comprising:
   an array substrate including
      a plurality of scan lines each extending in a first direction, the scan lines arranged in a second direction,
      a plurality of signal lines each extending in the second direction, the signal lines arranged in the first direction,
      a first detection element disposed in a first region surrounded by two scan lines adjacent to each other in the second direction and two signal lines adjacent to each other in the first direction, and
      a second detection element disposed in a second region adjacent to the first detection element in the first direction, the second detection element being surrounded by two scan lines adjacent to each other in the second direction and two signal lines adjacent to each other in the first direction; and
   an optical filter including
      a first light-transmitting resin layer having a first surface facing the first detection element and the second detection element, and a second surface opposite to the first surface,
      a single first light-blocking layer provided between the array substrate and the first surface of the first light-transmitting resin layer, and
      a plurality of lenses provided to a side of the second surface of the first light-transmitting resin layer,
   wherein
   the single first light-blocking layer includes:
      a plurality of openings arranged in a first arrangement pattern in the first region; and
      a plurality of openings arranged in a second arrangement pattern in the second region,
   the first arrangement pattern is different from the second arrangement pattern in planar view,
   the lenses in the first region are arranged a third arrangement pattern and overlap the openings arranged in the first arrangement pattern,
   the lenses in the second region are arranged a fourth arrangement pattern and overlap the openings arranged in the second arrangement pattern, and
   the third arrangement pattern is different from the fourth arrangement pattern, in planar view.

2. The detection device according to claim 1, wherein
   a count of the openings arranged in the first arrangement pattern is a same as a count of the openings arranged in the second arrangement pattern, and
   a count of the lenses arranged in the third arrangement pattern is a same as a count of the lenses arranged in the fourth arrangement pattern.

3. The detection device according to claim 2, wherein
   the second arrangement pattern is a pattern that the first arrangement pattern is rotated by 90° in the first direction, and
   the fourth arrangement pattern is a pattern that the third arrangement pattern is rotated by 90° in the first direction.

4. The detection device according to claim 2, wherein
   a count of the openings arranged in the first arrangement pattern is a same as a count of the lenses arranged in the fourth arrangement pattern.

5. A detection device comprising:
   an array substrate including
      a plurality of scan lines each extending in a first direction, the scan lines arranged in a second direction,
      a plurality of signal lines each extending in the second direction, the signal lines arranged in the first direction,
      a first detection element disposed in a first region surrounded by two scan lines adjacent to each other in the second direction and two signal lines adjacent to each other in the first direction, and
      a second detection element disposed in a second region adjacent to the first detection element in the first direction, the second detection element being surrounded by two scan lines adjacent to each other in the second direction and two signal lines adjacent to each other in the first direction; and
   an optical filter including
      a first light-transmitting resin layer having a first surface facing the first detection element and the second detection element, and a second surface opposite to the first surface,
      a single first light-blocking layer provided between the array substrate and the first surface of the first light-transmitting resin layer, and
      a plurality of lenses provided to a side of the second surface of the first light-transmitting resin layer,
   wherein
   the single first light-blocking layer includes:
      a plurality of openings arranged in a first arrangement pattern in the first region; and
      a plurality of openings arranged in a second arrangement pattern in the second region,
   the first arrangement pattern is different from the second arrangement pattern in planar view,
   the first detection element has a first photodiode, and
   the first photodiode covers most of the first region.

* * * * *